US012442494B2

(12) United States Patent
Hanwell

(10) Patent No.: US 12,442,494 B2
(45) Date of Patent: Oct. 14, 2025

(54) FLASHLIGHT HAVING MULTI-POSITION HEAD WITH DOWNLIGHT

(71) Applicant: Pelican Products, Inc., Torrance, CA (US)

(72) Inventor: John Edward Hanwell, Beverly Hills, CA (US)

(73) Assignee: Pelican Products, Inc., Torrance, CA (US)

( * ) Notice: Subject to any disclaimer, the term of this patent is extended or adjusted under 35 U.S.C. 154(b) by 0 days.

(21) Appl. No.: 18/944,473

(22) Filed: Nov. 12, 2024

(65) Prior Publication Data

US 2025/0230906 A1 Jul. 17, 2025

Related U.S. Application Data

(63) Continuation-in-part of application No. 18/410,344, filed on Jan. 11, 2024, now Pat. No. 12,146,623.

(51) Int. Cl.

| | |
|---|---|
| ***F21L 4/04*** | (2006.01) |
| ***F21V 17/14*** | (2006.01) |
| ***F21V 21/084*** | (2006.01) |
| ***F21V 21/14*** | (2006.01) |
| ***F21V 29/71*** | (2015.01) |
| ***F21V 29/89*** | (2015.01) |
| ***G01R 31/36*** | (2020.01) |

(52) U.S. Cl.

CPC .............. *F21L 4/045* (2013.01); *F21V 17/14* (2013.01); *F21V 21/084* (2013.01); *F21V 21/145* (2013.01); *F21V 29/713* (2015.01); *F21V 29/89* (2015.01); *G01R 31/3646* (2019.01)

(58) Field of Classification Search

None

See application file for complete search history.

(56) References Cited

U.S. PATENT DOCUMENTS

| | | |
|---|---|---|
| 1,832,443 A | 11/1931 | Barany |
| 5,410,457 A | 4/1995 | Parker |
| 6,158,874 A | 12/2000 | Brustein et al. |

(Continued)

FOREIGN PATENT DOCUMENTS

| | | |
|---|---|---|
| CN | 203395603 U | 1/2014 |

OTHER PUBLICATIONS

Extended European Search Report for corresponding European Application No. 25150668; 11 pages.

*Primary Examiner* — Alexander K Garlen

(74) *Attorney, Agent, or Firm* — Nelson Mullins Riley & Scarborough LLP

(57) ABSTRACT

Flashlights and methods of use. A flashlight includes a body that defines a longitudinal axis and a head releasably attached to the body. The head includes a front light defining a first axis parallel to the longitudinal axis and a downlight defining a second axis perpendicular to the longitudinal axis. A power source assembly disposed within the body comprises at least one battery disposed within a heat sink formed of a thermally-conductive metal material. The head is selectively attachable to the body in either of a first position and a second position. In the first position, the downlight faces a first direction relative to the body and in the second position the downlight faces a second direction relative to the body that is opposite the first direction.

19 Claims, 26 Drawing Sheets

(56) References Cited

U.S. PATENT DOCUMENTS

| | | | | |
|---|---|---|---|---|
| 7,033,041 | B2 | 4/2006 | Parker et al. | |
| 7,393,120 | B2 | 7/2008 | Kang et al. | |
| 8,562,169 | B2 | 10/2013 | Kempter | |
| 8,573,797 | B2 | 11/2013 | Spartano et al. | |
| 9,074,739 | B2 | 7/2015 | Deighton et al. | |
| 11,156,330 | B2 | 10/2021 | Grandadam | |
| 11,608,945 | B1 | 3/2023 | Hwang | |
| 11,729,889 | B2 | 8/2023 | Butler et al. | |
| 12,146,623 | B1 * | 11/2024 | Hanwell | F21L 4/08 |
| 2005/0254238 | A1 | 11/2005 | Parker et al. | |
| 2007/0103891 | A1 | 5/2007 | Schot | |
| 2007/0159815 | A1 | 7/2007 | Bayat et al. | |
| 2010/0084997 | A1 * | 4/2010 | Oberzeir | F21S 10/04 362/183 |
| 2010/0238652 | A1 * | 9/2010 | Liao | F21V 29/75 362/157 |
| 2010/0254135 | A1 | 10/2010 | Bayat et al. | |
| 2012/0008311 | A1 | 1/2012 | Opolka | |
| 2016/0178182 | A1 * | 6/2016 | Maglica | F21L 4/005 362/373 |
| 2020/0132279 | A1 | 4/2020 | Nakamura | |
| 2021/0172574 | A1 | 6/2021 | Grandadam | |

* cited by examiner

FLASHLIGHT HAVING MULTI-POSITION HEAD WITH DOWNLIGHT

CROSS-REFERENCE TO RELATED APPLICATIONS

This application is a continuation-in-part of U.S. application Ser. No. 18/410,344, entitled "Flashlight Having Multi-Position Head With Downlight," filed on Jan. 11, 2024, which is hereby relied upon and incorporated herein by reference in its entirety for all purposes.

FIELD

In general, embodiments of the present invention relate to handheld and helmet-mounted flashlights. Various particular embodiments of the present invention relate, among other things, to a flashlight having a removable head including a forward light and a downlight, wherein the head can be connected to a body or handle in at least two positions. The flashlight can be mounted, for example, on a helmet with the forward light and downlight facing the same respective directions regardless of the side of the helmet to which the flashlight is mounted.

BACKGROUND

Various handheld and user-worn lamps and flashlights are known. Additionally, it is known to provide a flashlight with a first light that shines forward from the flashlight and a second light or set of lights that emit light downwards from the flashlight, for example to illuminate a pathway of the flashlight's user. Such lights may be used, for instance, by military personnel, emergency workers, and first responders such as firefighters. Such lights can be provided with a clip that allows the flashlight to be fastened to the user's clothing (such as a belt, coat, harness, or backpack) so that flashlight need not be held by the user and can, at the same time, provide both forward light and downward light to illuminate a pathway. One example of such a light is disclosed in U.S. Pat. No. 9,074,739, entitled "Flashlight with Multiple Light Sources," the entire contents of which are incorporated by reference herein for all purposes. Further, it is known to provide a flashlight with a battery warning indicator that can be illuminated a given color to indicate that the flashlight's battery will run out within a predetermined amount of time.

BRIEF SUMMARY

In one embodiment, the present invention provides a flashlight. The flashlight comprises a body that defines a longitudinal axis and a head releasably attached to the body. The head comprises a front light defining a first axis parallel to the longitudinal axis and a downlight defining a second axis perpendicular to the longitudinal axis. An attachment feature is disposed on a lateral side of the body. The head is selectively attachable to the body in either of a first position and a second position. In the first position, the downlight faces a first direction relative to the body and in the second position the downlight faces a second direction relative to the body that is opposite the first direction.

In another embodiment, the present invention provides a flashlight. The flashlight comprises a body and a head releasably attached to the body. The head defines a proximal end and a distal end and includes a first light facing a first direction and a second light facing a second direction. The first and second directions are perpendicular to one another.

An indicator ring is disposed at the proximal end of the head. A power source is disposed in the body and is in electrical communication with the first and second lights and with the indicator ring. The indicator ring is selectively illuminable about its periphery in response to a level of charge of the power source.

In another embodiment, the present invention provides a method of using a flashlight. The method comprises providing a flashlight comprising a body defining a longitudinal axis and a head that is selectively attachable to the body. The head comprises a first light defining a first axis parallel to the longitudinal axis and a second light defining a second axis perpendicular to the longitudinal axis. The method also comprises attaching the head to the body in a first position wherein the second light faces a first direction relative to the body. Also, the method comprises repositioning the head with respect to the body in a second position wherein the second light faces a second direction relative to the body that is opposite the first direction.

In yet another embodiment, the present invention provides a flashlight. The flashlight comprises a body defining a longitudinal axis and a head coupled with the body via a dual-position bayonet fitting. The head comprises a first light defining a first axis parallel to the longitudinal axis and a second light defining a second axis perpendicular to the longitudinal axis. When the head is fitted to the body via the dual-position bayonet fitting in a first orientation, the second light faces a first direction. When the head is fitted to the body via the dual-position bayonet fitting in a second orientation, the second light faces a second direction opposite the first direction.

According to a further embodiment, the present invention comprises a flashlight. The flashlight comprises a body that defines a longitudinal axis and a head releasably attached to the body. The head comprises a front light defining a first axis parallel to the longitudinal axis and a downlight defining a second axis perpendicular to the longitudinal axis. The flashlight also comprises a power source assembly comprising at least one battery and at least one heat sink coupled with an exterior surface of the at least one battery to dissipate heat therefrom during use of the flashlight. The at least one heat sink comprises at least one aluminum sleeve.

In a further embodiment, the present invention comprises a flashlight comprising a body and a head releasably attached to the body defining a proximal end and a distal end. The head comprises a first light facing a first direction and a second light facing a second direction. The first and second directions are perpendicular to one another. A power source assembly is disposed in the body and in electrical communication with the first and second lights. The power source assembly comprises at least one battery disposed within a heat sink formed of a thermally-conductive metal material.

Another embodiment of the present invention comprises a method of using a flashlight. The method comprises providing a flashlight comprising a body defining a longitudinal axis and a head that is selectively attachable to the body. The head comprises a first light defining a first axis parallel to the longitudinal axis and a second light defining a second axis perpendicular to the longitudinal axis. The flashlight also comprises a power source assembly comprising at least one battery coupled with a heat sink. The method also includes attaching the head to the body in a first position wherein the second light faces a first direction relative to the body. Further, the method comprises repositioning the head with respect to the body in a second position wherein the second light faces a second direction relative to the body that is opposite the first direction.

BRIEF DESCRIPTION OF THE DRAWINGS

Reference will now be made to the accompanying drawings, which are not necessarily drawn to scale, and wherein.

DETAILED DESCRIPTION

Figure 1A:
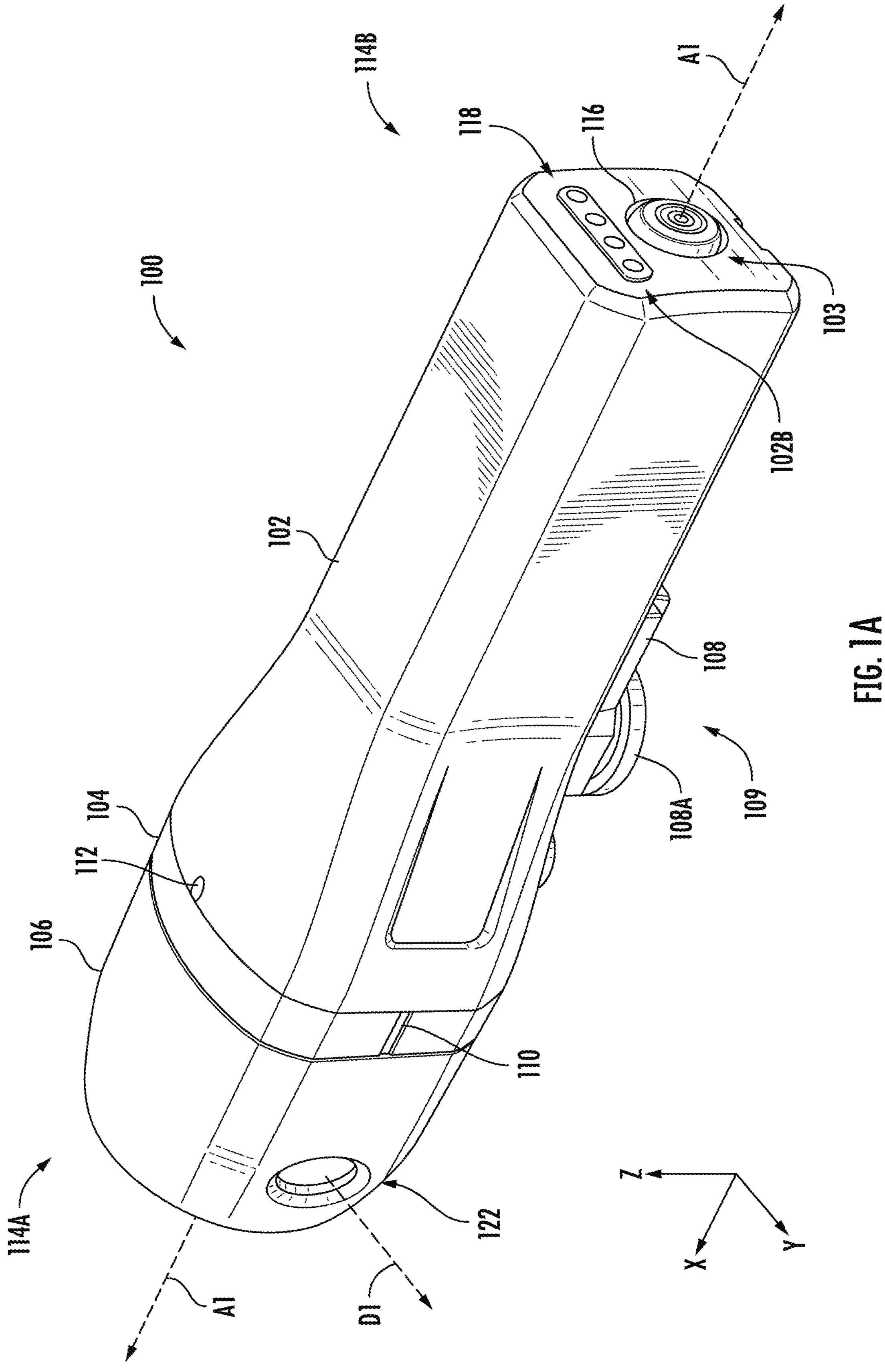
FIG. 1A is a perspective view of a flashlight wherein a head of the flashlight is in a first position relative to a body of the flashlight in accordance with an embodiment of the present invention.

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

As used herein, terms referring to a direction or a position relative to the orientation of a flashlight, such as but not limited to "vertical," "horizontal," "upper," "lower," "front," or "rear," refer to directions and relative positions with respect to the flashlight's orientation in its normal intended operation, as indicated in the Figures herein. Thus, for instance, the terms "vertical" and "upper" refer to the vertical direction and relative upper position in the perspectives of the Figures and should be understood in that context, even with respect to an apparatus that may be disposed in a different orientation. The term "substantially," as used herein, should be interpreted as "nearly" or "close to", such as to account for design and manufacturing tolerances of the apparatus.

Moreover, the term "or" as used in this application and the appended claims is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may. The phrase "at least one of A and B" is satisfied by any of A alone, B alone, A and B alone, and A and B with others. The phrase "one of A and B" is satisfied by A, whether or not also in the presence of B, and by B, whether or not also in the presence of A.

Embodiments of the invention relate to a flashlight comprising a body and a head that can be attached to the body in at least two positions. The head includes a first light which is configured to emit light in a first direction, with this first direction being generally in the forward direction of the flashlight. In various embodiments, the head also includes a second light which is configured to emit light in a second direction, e.g., perpendicular to the first direction. The flashlight is attachable to a helmet on either a first lateral side of the helmet or on a second lateral side of the helmet. When positioned on the first lateral side of the helmet, the head of the flashlight may be positioned in a first position relative to the body of the flashlight so that the second light generally emits light in a downward direction. When positioned on the second lateral side of the helmet, the head of the flashlight may be positioned in a second position rather than the first position so that the second light is still able to generally emit light in a downward direction.

By providing a head that is configured to be attached to the body in at least two positions, the second light may be effectively utilized as a downlight regardless of the side of the helmet to which the flashlight is attached. Without the ability to selectively attach the head, light at the second light may be emitted downwardly when the flashlight is on a first lateral side of the helmet, but the light at the second light would then be emitted upwardly when the flashlight is on a second lateral side of the helmet, or vice versa. Additionally, while embodiments are contemplated in which a flashlight may have a head comprising three or more lights, in some embodiments, by allowing the head to be selectively attachable in the first position and the second position, the head only needs to be provided with a first, front light and a second, downlight.

Thus, flashlights in accordance with various embodiments may be manufactured in a more cost-effective manner. Moreover, flashlights in accordance with various embodiments allow the user to attach the flashlight to the side of the helmet that the user prefers and/or may also allow helmet to be used with other specialized equipment (e.g., headsets) used by military, first responders, or other emergency personnel. For example, where certain specialized equipment must be placed on one lateral side of the helmet and would interfere with the flashlight, the flashlight may be moved to the other lateral side of the helmet so that both the flashlight and the other specialized equipment may be utilized.

In this regard, FIGS. 1A-3 illustrate a flashlight 100 in accordance with one embodiment. The flashlight 100 extends between a first end 114A and a second end 114B and comprises a body 102. The body 102 defines a longitudinal axis A1, and this longitudinal axis A1 is substantially parallel to the X-axis in FIG. 1A.

The flashlight 100 also comprises a head 106 that is releasably attachable to the body 102 in this embodiment. The head 106 comprises a first light 120 (e.g., a front or forward-facing light) defining a first axis. In FIGS. 1A, 1B, and 2-3, the first axis and the longitudinal axis A1 are the same, but these axes may be separated and parallel in other embodiments. In still other embodiments, the first axis and the longitudinal axis may be at an acute angle to one another. The head 106 also comprises a second light 122 (e.g., a downlight or downward-facing light). The second light 122 defines a second axis. In the embodiment of FIG. 1A, the second light 122 generally emits light in a first direction D1 along the second axis. This second axis is perpendicular to the longitudinal axis A1 and the first axis in this embodiment. As discussed in more detail herein, in FIG. 1B, the second light 122 generally emits light in a second direction D2 along the second axis, with the second direction D2 being opposite to the first direction D1.

Figure 10A:
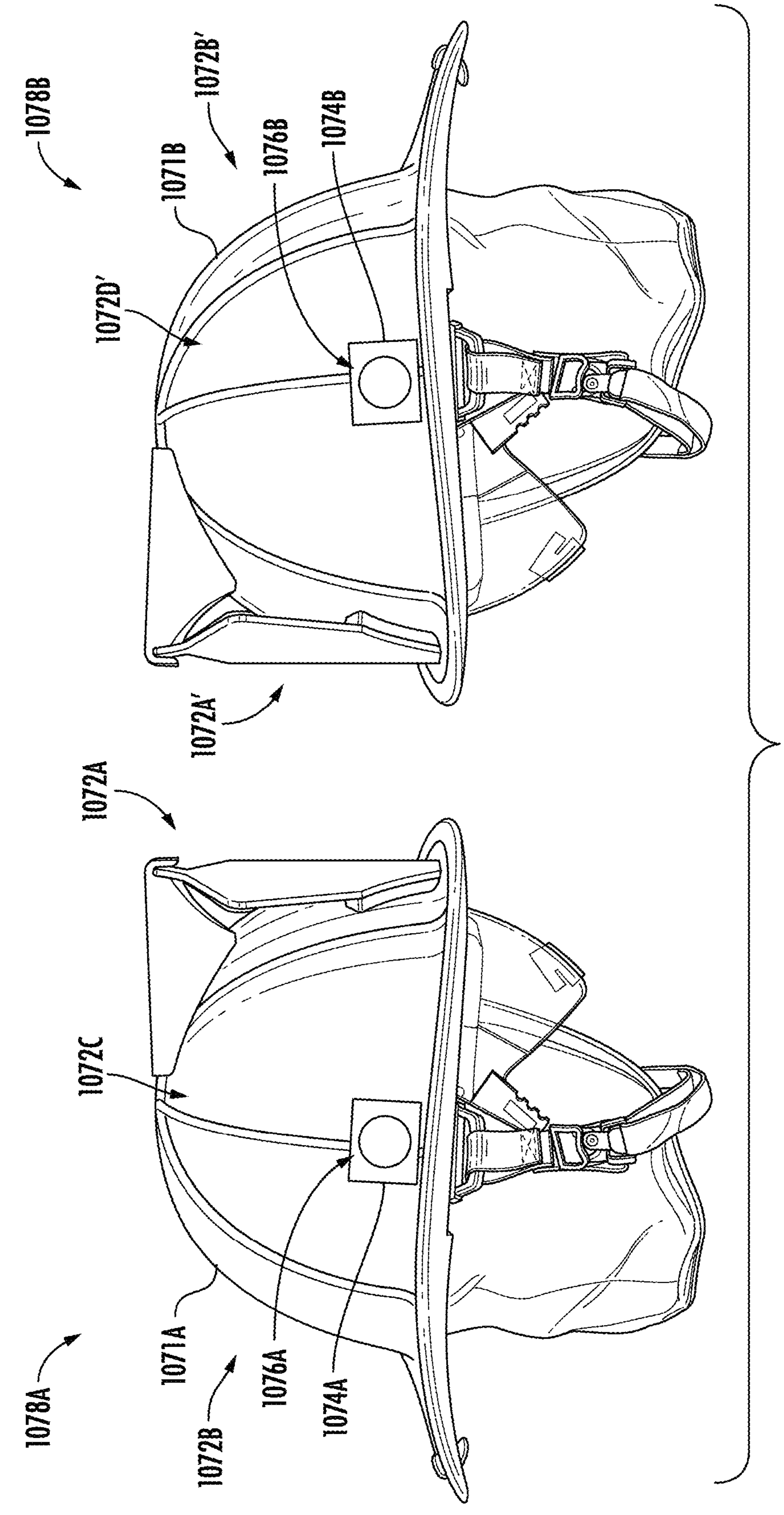
FIG. 10A is a schematic view of two helmet assemblies in accordance with an embodiment of the present invention.

Although not required in all embodiments, in the illustrated embodiment a member 108 is coupled with the body on a lateral side 109 thereof. Member 108 can facilitate attachment of electrical contacts 170A, 170B to body 102 and may also serve as a hand grip for a user. Further, member 108 includes an attachment feature 108A in this embodiment, though in other embodiments an attachment feature could be included in other locations on and/or integrally formed with body 108A, if provided. In this embodiment, attachment feature 108A is configured to engage with a complementary bracket that could be coupled with a user's clothing, backpack, or on a helmet, for example. Referring for instance to FIG. 10A, the attachment feature 108A may enable attachment to a bracket 1074A on a first lateral side 1072C of helmet 1071A, or the attachment feature 108A may enable attachment to a bracket 1074B on a second lateral side side 1072D' of helmet 1071B. Attachment feature 108A can take any suitable form in various embodiments, and its size and shape will depend among other things on the geometry of the particular bracket or helmet to which it is to be attached. Here, though, attachment feature 108A comprises a cylindrical projection with a circumferential notch that may be sized to receive a tab or slot in a bracket.

Figure 2:
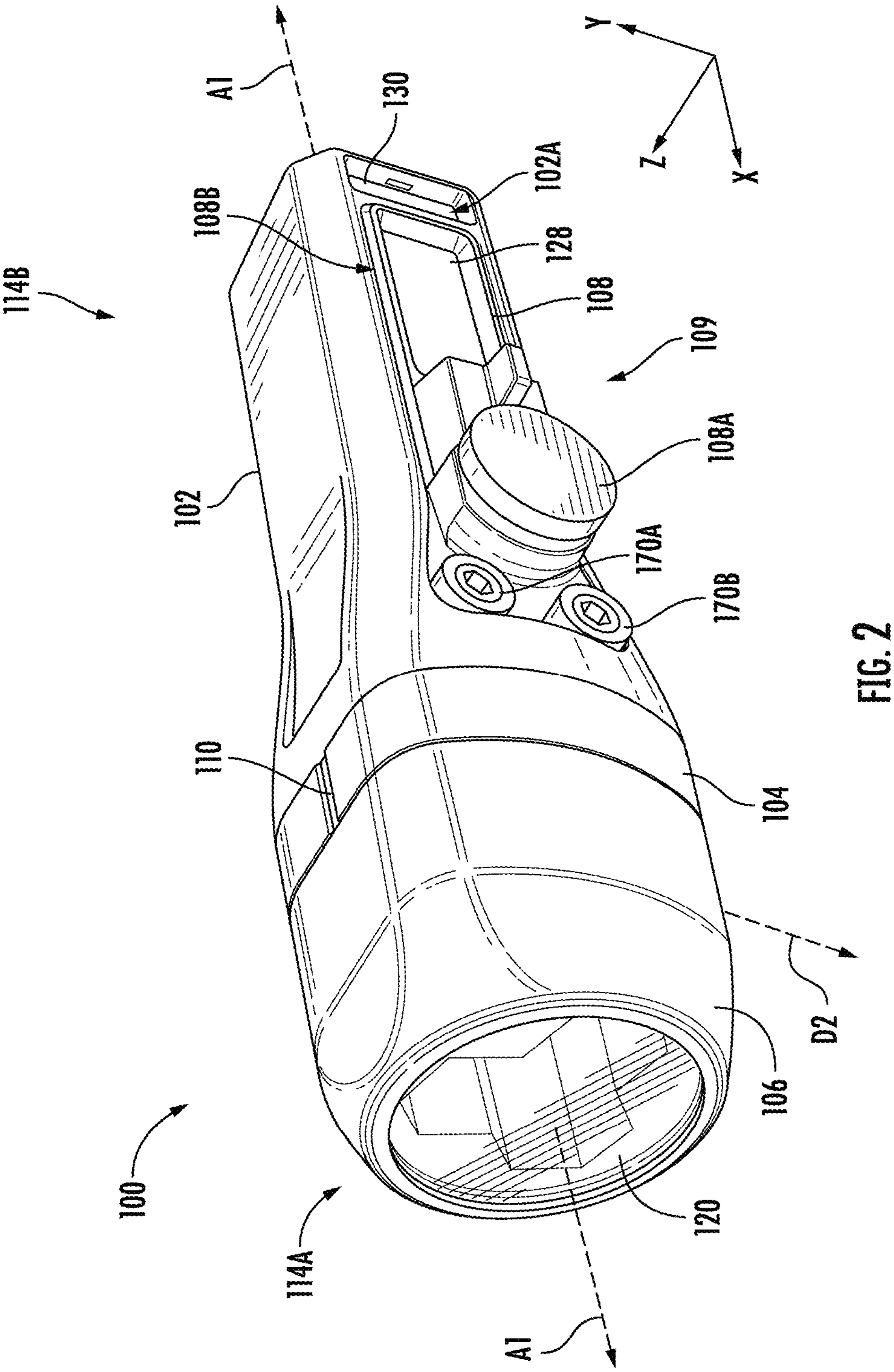
FIGS. 2-3 are perspective views showing different angles of the flashlight of FIG. 1A, with its head in the position shown in FIG. 1B, in accordance with an embodiment of the present invention.
Figure 3:
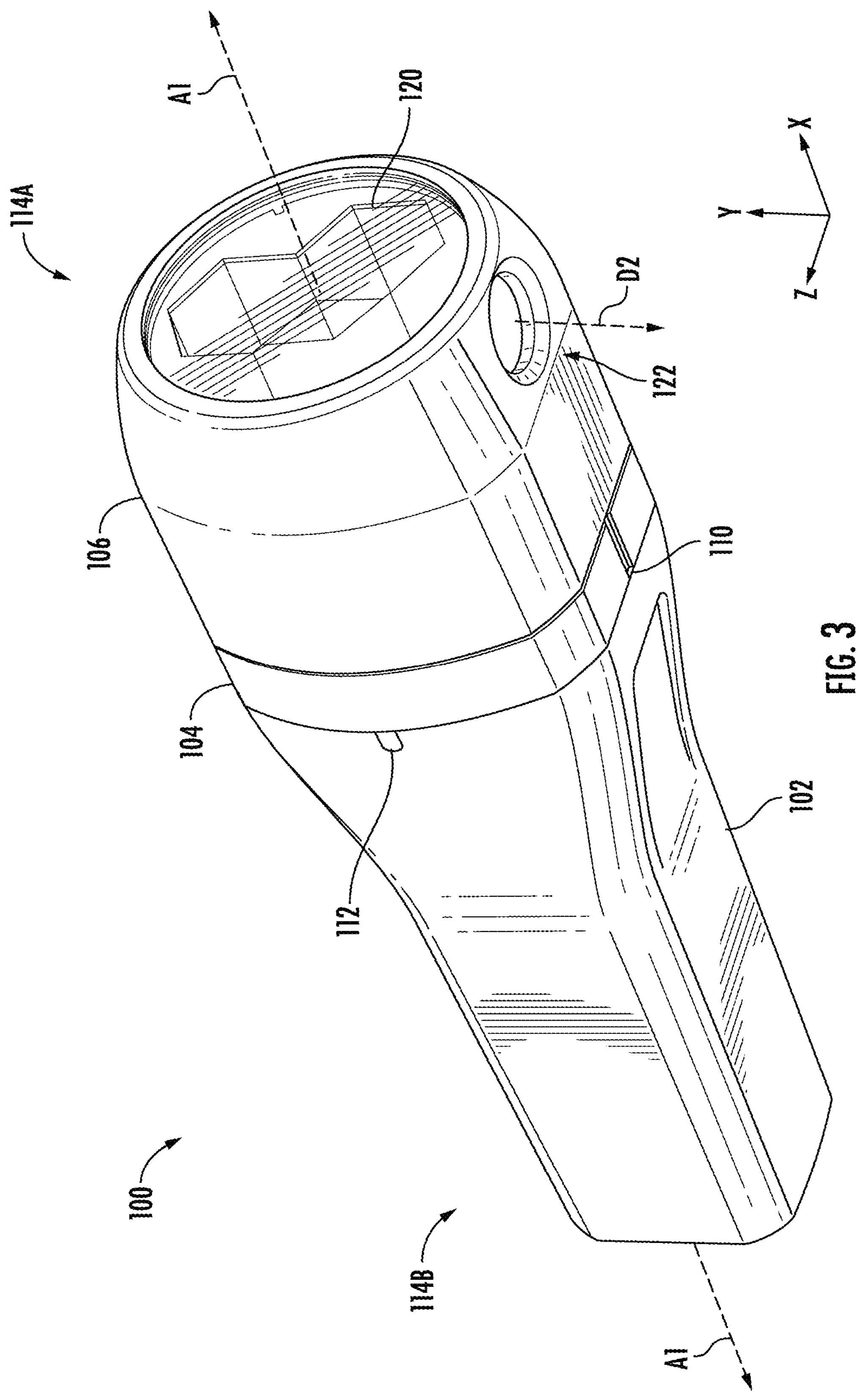

Also not required in all embodiments, in this embodiment member 108 defines an opening 108B. When the flashlight 100 is fully assembled as illustrated in FIG. 2, the opening 108B can expose a plate 128. The plate 128 can present information about the flashlight 100 and/or be a label or contain some other indicia. Similarly, a recess 102A is defined on the lateral side 109 proximate to the second end 114B of the flashlight 100 and proximate opening 108B in this embodiment. In some embodiments, recess 102A can define an opening through which a strap may be attached. In the illustrated embodiment, however, a plate 130 is disposed in the recess 102A. The plate 130 can provide information or indicia like plate 128 in some embodiments.

As noted above, electrical contacts 170A, 170B are coupled with body 102 via member 108. As shown, the electrical contacts 170A, 170B are exposed on the lateral side 109 of the body 102 and extend internally into the body 102 so that the electrical contacts 170A, 170B form a circuit with other electrical circuitry within the body 102. As discussed further herein, the flashlight 100 may be positioned within a charger unit (such as charger unit 760 of FIG. 7). When the flashlight 100 is positioned appropriately within the charger unit 760, electrical contacts 170A, 170B of a flashlight may come in contact with electrical contacts 768A, 768B of charger unit 760, allowing for a circuit to be formed so that the flashlight 100 may be charged. However, electrical contacts 170A, 170B may be provided in different shapes or forms, and a different number of electrical contacts 170A, 170B may be utilized in other embodiments. Alternatively, the flashlight 100 may be charged in other ways such as through the use of a plug-in cable, the use of one or more batteries, etc.

The head 106 may be selectively and releasably attachable to the body 102 in two or more positions. For example, the head 106 is illustrated in a first position relative to the body 102 in FIG. 1A, and the head 106 is illustrated in a second position relative to the body 102 in FIG. 1B. In the first position, the head 106 is attached to the body 102 such that second light 122 faces in a first direction D1, which extends in the positive Y-direction relative to the Y-axis. In the second position illustrated in FIG. 1B, the head 106 is attached to the body 102 such that second light 122 faces in a second direction D2 that is opposite the first direction D1, and the second direction D2 extends in the negative Y-direction relative to the Y-axis.

The flashlight 100 also comprises an indicator ring 104 in this embodiment. As described herein, the indicator ring 104 may be or comprise an optical element in some embodiments, and thus indicator ring 104 may be an indicator light in some cases, though that is not required. In this embodiment, indicator ring 104 is disposed between the head 106 and the body 102 when the head 106 is attached to the body 102, and the indicator ring 104 may form a portion of an exterior surface of the flashlight 100 when the flashlight 100 is assembled. While the indicator ring 104 is attached to the head 102 as shown herein, indicator ring 104 also could be attached to body 102 and/or could be located in other positions on flashlight 100.

The indicator ring 104 can be a diffuser or lens or other optical element in which light travels or internally reflects that can illuminate to indicate a status of flashlight 100. The indicator ring 104 can also be formed of a translucent plastic material and can be selectively illuminable at least about its periphery. Indicator ring 104 extends through 360 degrees of angular rotation in this embodiment, and thus is visible on all sides, but in other embodiments indicator ring 104 (or at least an illuminable portion thereof) can extend less than 360 degrees in other embodiments.

The indicator ring 104 may be caused to illuminate in one or more colors based on various criteria related to the operation of flashlight 100. For example, indicator ring 104 can be illuminated a first color when a charge level of a power source within the flashlight 100 exceeds a predetermined threshold, and the indicator ring 104 may illuminate in a second color when a charge level of the power source is below a predetermined threshold, though any number of thresholds can be used in various embodiments. In some embodiments, the first color may be green and the second color may be red, but other colors may be utilized as well. In one particular example, indicator ring 104 will glow green when there is more than thirty-five (35) minutes of energy left in the battery, and it will glow red when there is less than thirty-five (35) minutes of energy left. In this regard, the 35-minute threshold may be used in a firefighting or other emergency application, and if the indicator ring 104 is glowing red, that can indicate to the user that the light will not last as long as the air in the user's breathing apparatus. Additionally or alternatively, the indicator ring 104 may provide indications in other ways such as flashing light in the indicator ring 104 in regular intervals, changing the intensity or brightness level of the light, etc.

The indicator ring 104 can also be caused to illuminate in one or more colors based on different information. For example, the indicator ring 104 may be illuminable in a first color corresponding to a first amount of operating time remaining for the first light, and the indicator ring 104 may be illuminable in a second color corresponding to a second amount of operating time remaining for the first light, with the second amount of operating time remaining being less than the first amount of operating time remaining. The indicator ring 104 may also be illuminated in a certain color dependent on other features. For example, the color or lack of color for indicator ring 104 may be dependent upon the light mode (e.g., flood light mode, spot light mode) for the first light 120, whether the second light 122 is positioned appropriately relative to the body 102, whether the attachment feature 108A is attached to a helmet, whether the flashlight 100, the first light 120, and/or the second light 122 are powered on, etc.

In other embodiments, the indicator ring 104 may indicate that the charge level is either above or below the predetermined threshold when indicator ring 104 is not illuminated at all. For example, the indicator ring 104 may illuminate in a color when a charge level of a power source within the flashlight 100 exceeds a predetermined threshold, and the indicator ring 104 may not be illuminated at all when a charge level of the power source is below a predetermined threshold. Alternatively, the indicator ring 104 may not be illuminated at all when a charge level of a power source within the flashlight 100 exceeds a predetermined threshold, and the indicator ring 104 may illuminate in a color when a charge level of the power source is below a predetermined threshold. In some embodiments, the color may be red, green, blue, or white, but other colors may be utilized as well.

In various embodiments, the first light 120 can be configured to operate in various modes, such as a flood light and/or a spot light. In one example, when operating as a flood light, the first light 120 can generally emit light outwardly within a cone defining about a 90 degree angle, with the longitudinal axis A1 defining a center of the cone. Further, when operating as a spot light, the first light 120 can generally emit light outwardly within a cone defining about a 12 degree angle, with the second axis (which is colinear with the first direction D1 and the second direction D2) defining a center of the cone.

Figure 1B:
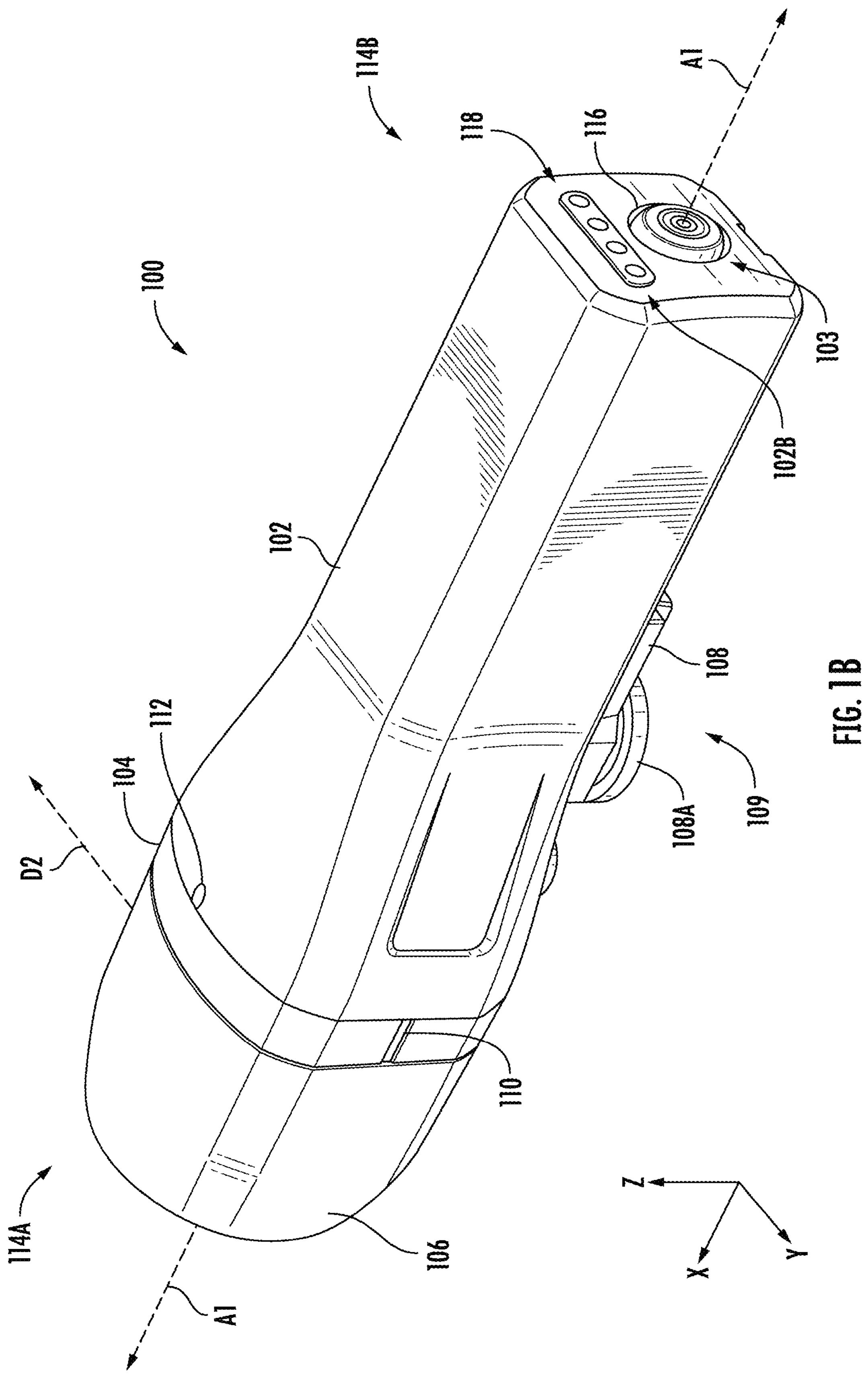
FIG. 1B is a perspective view of the flashlight of FIG. 1A wherein the head of the flashlight is in a second position relative to the body in accordance with an embodiment of the present invention.

As best seen in FIGS. 1A and 1B, the flashlight 100 includes a switch 116, which in this embodiment is located at second end 114B of flashlight 100 opposte head 106, which is located at first end 114A. The switch 116 is actuatable to cause illumination of the first light 120, the second light 122, and/or the indicator ring 104 in various combinations. The switch 116 being disposed at an end of the body 102 opposite the head 106 can make it easier for a user to turn flashlight 100 on and off when it is attached to a helmet and/or when the user is wearing gloves. However, in other embodiments, switch 116 (or another suitable switch) can be positioned at another location on the body 102 or on the flashlight 100.

In the illustrated embodiment, body 102 defines openings 102B, 103 at second end 114B of the flashlight 100. As shown, these openings 102B, 103 are positioned on a back face of the body 102 facing in the negative X-direction, but the openings 102B, 103 may be positioned at other locations on the body 102. Opening 102B allows a charge indicator 118 to extend through the opening 102B so that the charge indicator 118 may be seen by a user. The charge indicator 118 in this embodiment includes one or more lights to indicate the charge level of a power source 154 within the flashlight. The lights for the charge indicator 118 can be illuminated in a red color, but the lights for the charge indicator 118 may be illuminated in other colors in other embodiments. In some embodiments, the charge indicator 118 can include four lights, the charge may be greatest when all four lights are illuminated, and the charge may be lowest when zero lights or only one of the lights are illuminated. The charge indicator 118 can also operate in other modes or configurations, such as by where its lights are caused to blink when the flashlight charge level is very low. Additionally or alternatively, the charge indicator 118 lights can be caused to blink when the flashlight 100 is actively being charged so that a user knows that the flashlight 100 is positioned correctly in a charger unit.

Opening 103 allows a switch 116 to extend through the opening 103 so that the switch 116 may be accessed. Switch 116 is a push-button on-off switch in this embodiment, but the switch 116 could also be provided in other forms in other embodiments. As noted, the switch 116 can optionally allow for the flashlight 100 to operate in three or more modes. For example, the switch 116 can be pressed once to allow the flashlight 100 to operate with a first light and a second light both on in a first mode, the switch can be pressed a second time to allow the flashlight 100 to operate in a second mode where the first light is on and the second light is off, the switch can be pressed a third time to allow the flashlight 100 to operate in a third mode where the first light is off and the second light is on, and the switch can be pressed a fourth time to turn the flashlight 100 off. In some embodiments, switch 116 and/or another switch or user interface may enable the brightness level of the flashlight to be modified.

Figure 4A:
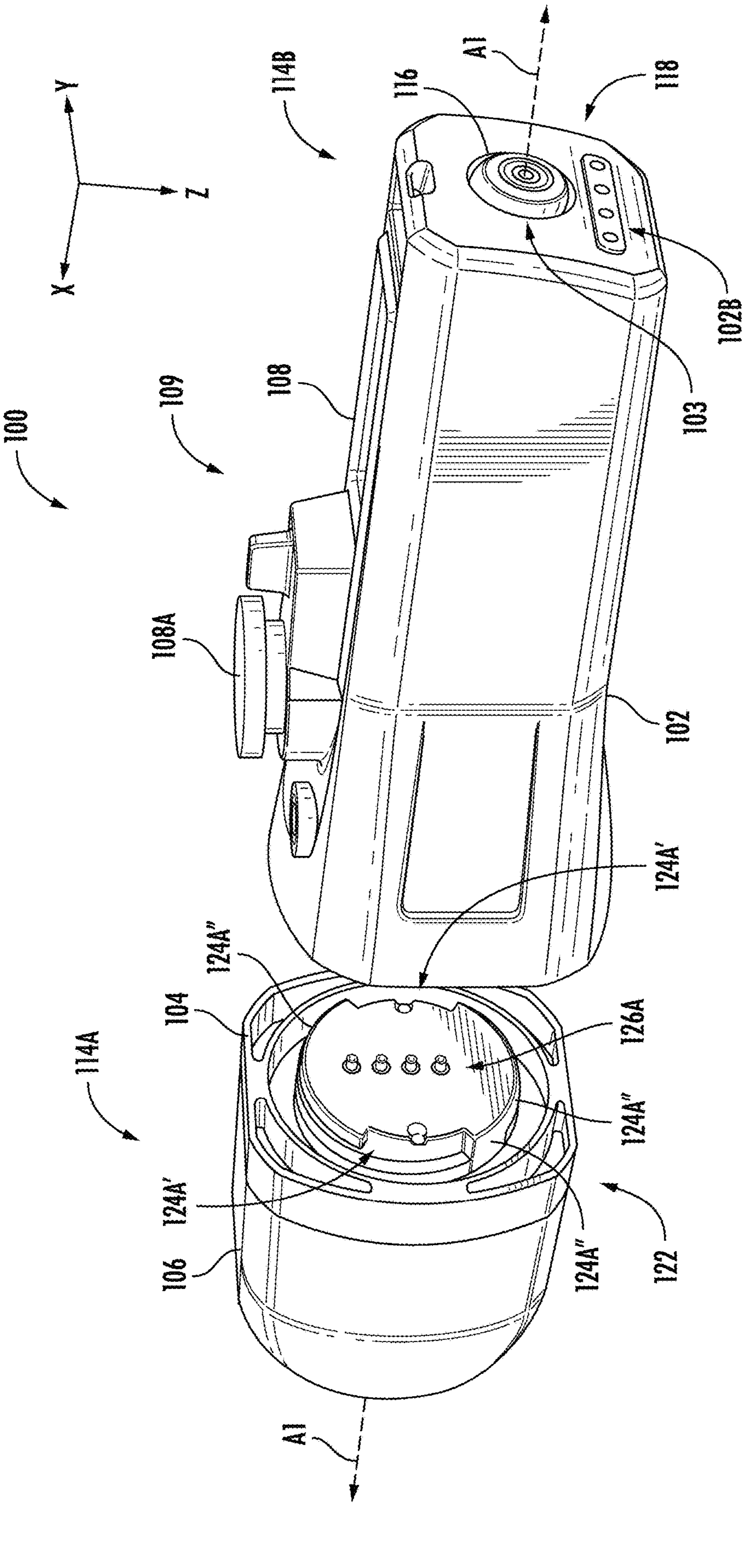
FIG. 4A is a perspective view of the flashlight of FIG. 1A wherein the head of the flashlight has been rotated clockwise from the position shown in FIG. 1A and then separated from the body of the flashlight in accordance with an embodiment of the present invention.
Figure 4B:
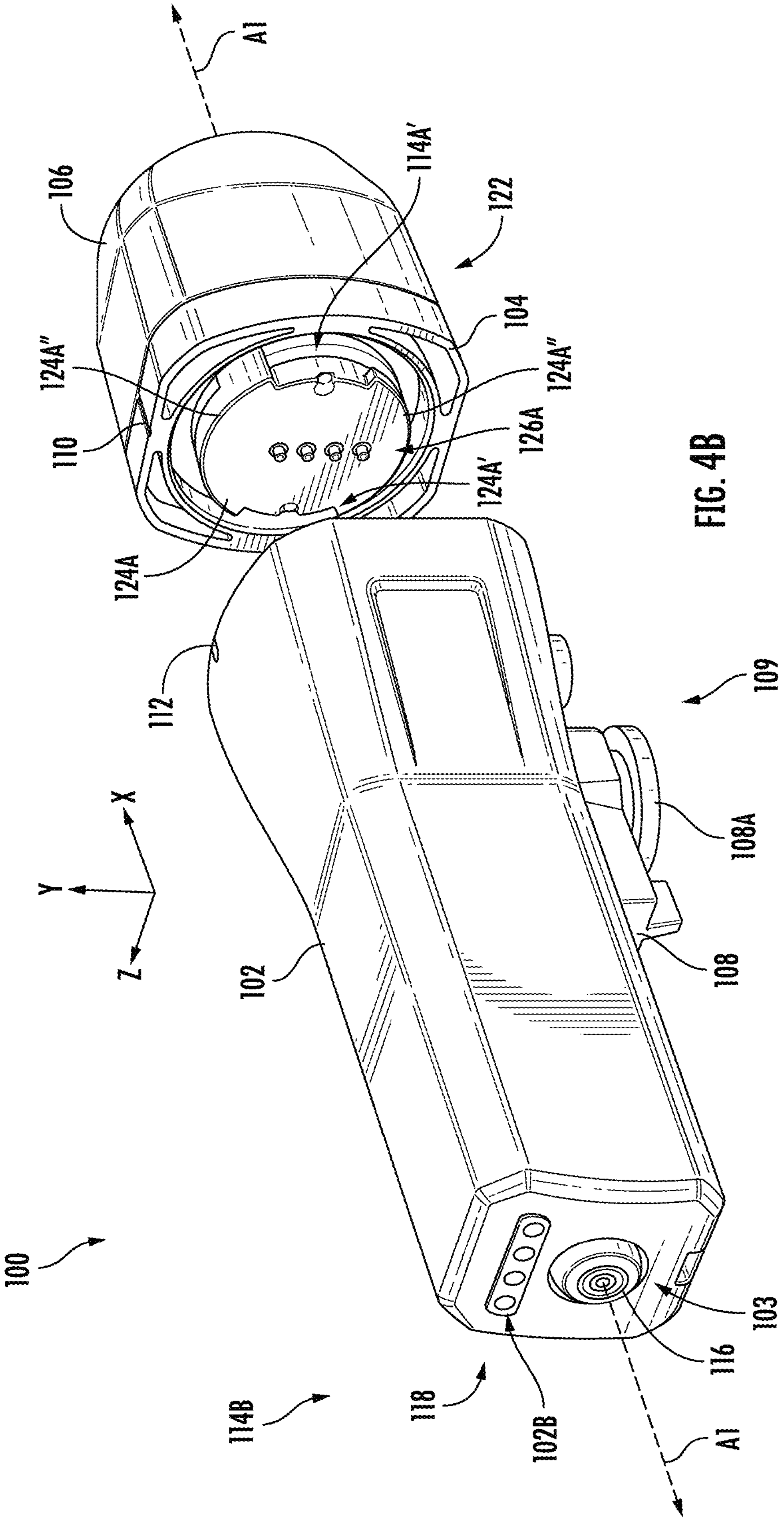
FIGS. 4B-4C are perspective views of the flashlight of FIG. 1A wherein the head of the flashlight has been rotated clockwise from the position shown in FIG. 1B and then separated from the body of the flashlight in accordance with an embodiment of the present invention.
Figure 4C:
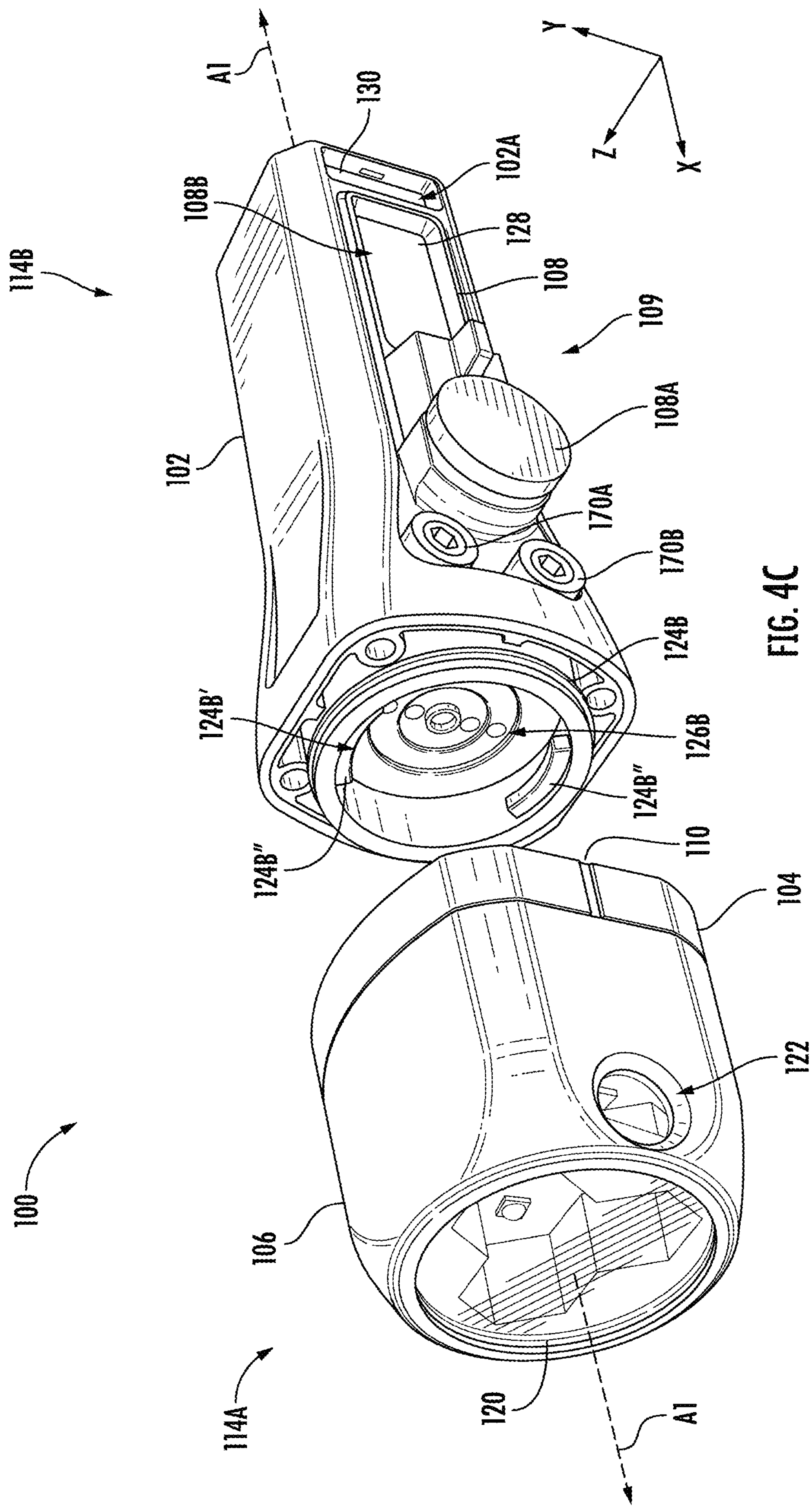

Referring now also to FIGS. 4A-4C, flashlight 100 is shown with head 106 having been rotated clockwise relative to body 102 from the position shown in FIG. 1B and then separated from body 102. In this regard, in various embodiments flashlight 100 can comprise a fitting via which head 106 is releasably coupled with body 102 (with or without indicator ring 104). In some example embodiments, the fitting can be a bayonet fitting or the like that allows head 106 to be coupled with body 102 in at least two distinct orientations. However, other fittings, including threaded fittings, snap fittings, and latches could be used in other embodiments.

Figure 6:
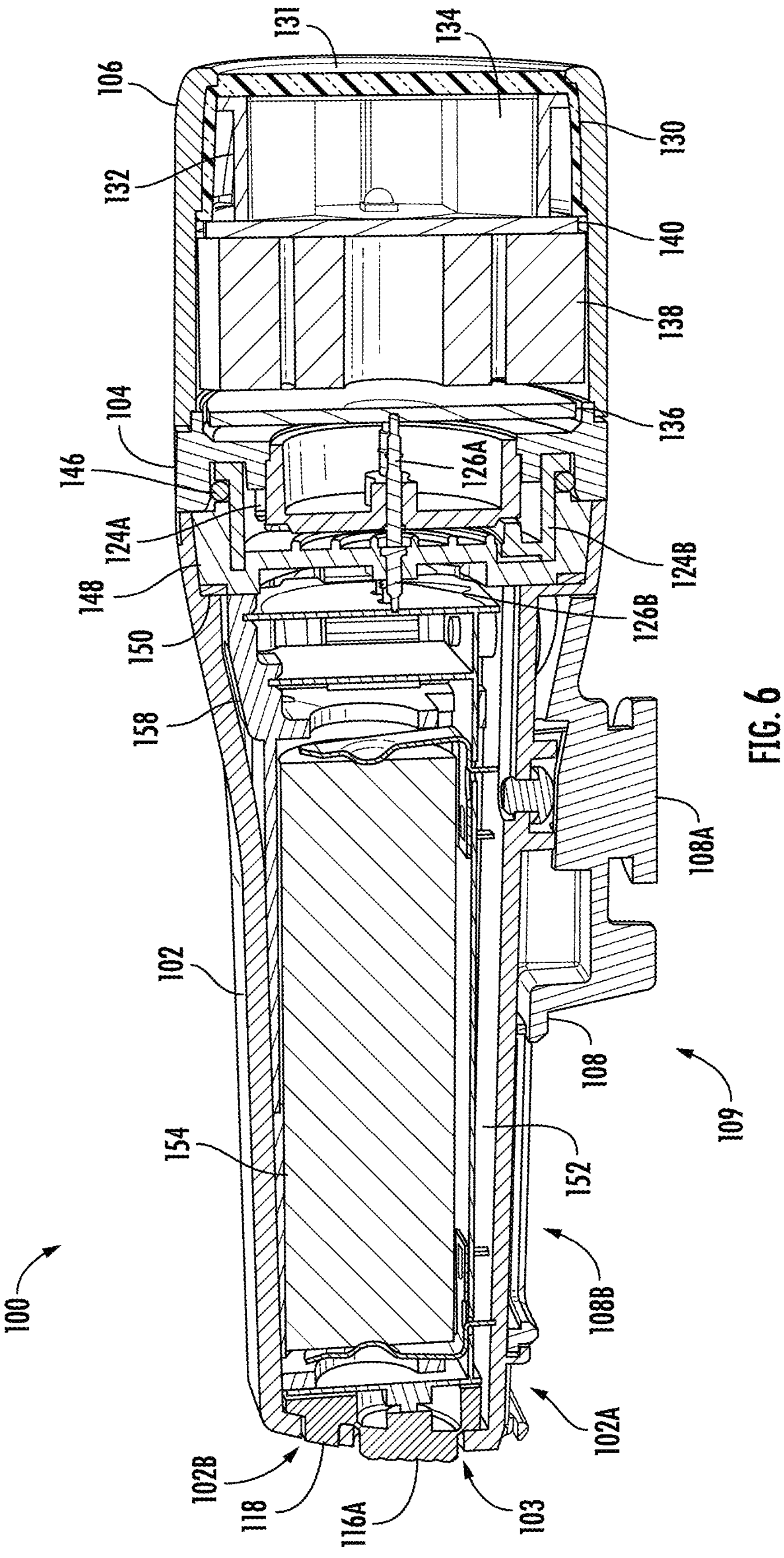
FIG. 6 is a cross-sectional view of the flashlight of FIG. 1A in accordance with an embodiment of the present invention.

In this regard, one example fitting comprises a female member 124A (see FIGS. 4A-4B), which in this case is coupled with head 106, and a male member 124B (see FIG. 4C), which in this case is coupled with body 102, though of course the opposite could be true in other embodiments. In this embodiment, female member 124A comprises a generally cylindrical solid member projecting longitudinally outward from head 106, and in which pair of "L"-shaped slots or grooves 124A' are defined opposite one another in the peripheral cylindrical surface. Each slot or groove 124A' can comprise a vertical portion extending parallel to the longitudinal axis A1 with an angular extent of about sixty (60) degrees and a circumferential portion that extends about a portion of the peripheral cylindrical surface, for example through an angle of about ninety (90) degrees beyond the vertical portion in a clockwise direction when facing female member 124A. Reference numeral 124A" denotes the top surface of female member 124A, which top surface extends radially outward of the circumferential portions of slots or grooves 124A' but which has a smaller radius at the vertical portions of slots or grooves 124A'. The female member 124A also has two opposite stop portions in which no groove or slot is defined that extend about thirty (30) degrees between each slot or groove 124A'. Also, as best seen in FIG. 6, in this embodiment indicator ring 104 surrounds and carries female member 124A, and indicator ring 104 also defines a slot with a diameter exceeding that of both female member 124A and male member 124B to allow male member 124B to be received over female member 124A and within indicator ring 104 when head 106 is coupled with body 102.

In the embodiment shown in the Figures, the vertical portions of slots or grooves 124A' are disposed at angular positions between about sixty (60) degrees and about one hundred twenty (120) degrees and between about two hundred forty (240) degrees and about three hundred (300) degrees when viewing top surface 124A" in plan. The circumferential portions of slots or grooves 124A' are disposed at angular positions between about one hundred twenty (120) degrees and about two hundred ten (210) degrees and between about two hundred forty (240) degrees and about thirty (30) degrees.

Male member 124B in this embodiment comprises a generally cylindrical collar projecting longitudinally outward from body 102. The collar defines an internal opening 124B' having a diameter slightly larger than the diameter of top surface 124A" of female member 124A. Further, the collar defines a pair of tabs 124B" that project radially inward from the collar. The tabs 124B" preferably have a complementary shape and angular extent to that of the vertical portions of slots or grooves 124A' and a thickness that corresponds to the thickness of the circumferential portions of slots or grooves 124A'. The tabs 124B" are disposed opposite one another on the collar and at angular locations that cause the second light 122 to be in either of the first position shown in FIG. 1A or the second position shown in FIG. 1B when head 106 is coupled with body 102 and then rotated a predetermined amount (e.g., ninety (90) degrees) to mate the male and female members 124B, 124A of the fitting together.

In this regard, when head 106 is brought into engagement with body 102 along the longitudinal direction, tabs 124B" are first received in the vertical portions of slots or grooves 124A'. The indicator ring 104 and body 102 can include markings to assist in the assembly of the flashlight 100 and in locating tabs 124B" in slots or grooves 124A'. For example, indicator ring 104 in this embodiment includes markings 110 proximate to the center of two of its opposing sides, and body 102 includes a marking 112. When assembling head 106 with body 102, a user can align one of markings 110 with the marking 112 (depending on which direction the user wants second light 122 to face after assembly) so that tabs 124B" will be received in slots or grooves 124A' when the head 106 and body 102 are moved longitudinally together. The user can then rotate head 106 in a counter-clockwise direction relative to body 102 to cause tabs 124B" to slide within the circumferential portions of each slot or groove 124A' until the stop portions of female member 124A are reached.

In the example of FIG. 4B, the direction D1 of second light 122 is aligned with the negative Z-axis. If a user were to bring head 106 into engagement with body 102 (aligning markings 110 and 112) and then rotate head 106 counter-clockwise by about ninety (90) degrees, second light 122 would move to the second position shown in FIG. 1B, wherein direction D2 is aligned with the negative Y-axis. If in this position the second light is facing the wrong direction for the side of, e.g., a helmet that the user wants to attach flashlight 100 to, the user could rotate head 106 clockwise relative to body 102 by ninety (90) degrees and then separate head 106 from body 102. The user could then rotate head 106 one hundred eighty (180) degrees about longitudinal axis A1 such that the opposite marking 110 is on top (and direction D1 is aligned with the positive Z-axis as shown in FIG. 4A). The user could then reassemble the head 106 with the body 102. In doing so, head 106 will be rotated so that second light 122 is in the first position shown in FIG. 1A (wherein direction D1 is aligned with the positive Y-axis).

Of course, in other embodiments, female member 124A could comprise a cylindrical collar with an opening defined therein, and male member 124B could comprise a cylindrical solid with radially-extending tabs. Those of skill in the art will appreciate that other configurations are contemplated and within the scope of the present invention.

One or more electrical contacts 126B are positioned on the body 102, and in this embodiment these electrical contacts 126B are disposed in a line within internal opening 124B' and, more specifically, disposed in a sealing member 148 that carries male member 124B. Head 106 also comprises one or more pins 126A, and in this embodiment pins 126A are positioned so that they protrude in a line from female member 124A. However, in other embodiments, the relative positions of pins 126A and electrical contacts 126B could be reversed, and the pins 126A and contacts 126 do not need to be arranged in a line. In any event, pins 126A are preferably oriented to engage electrical contacts 126B once the head 106 and body 102 are assembled together, regardless of the orientation of head 106 relative to body 102. (When head 106 and body 102 are disassembled from one another, as shown for instance in FIGS. 4B and 4C, the line of pins 126A and the line of contacts 126B may be disposed at right angles to one another.) As will be appreciated, engagement between pins 126A and electrical contacts 126B enables conduction of electricity from the body 102 to the the electrical components in head 106.

Figure 5A:
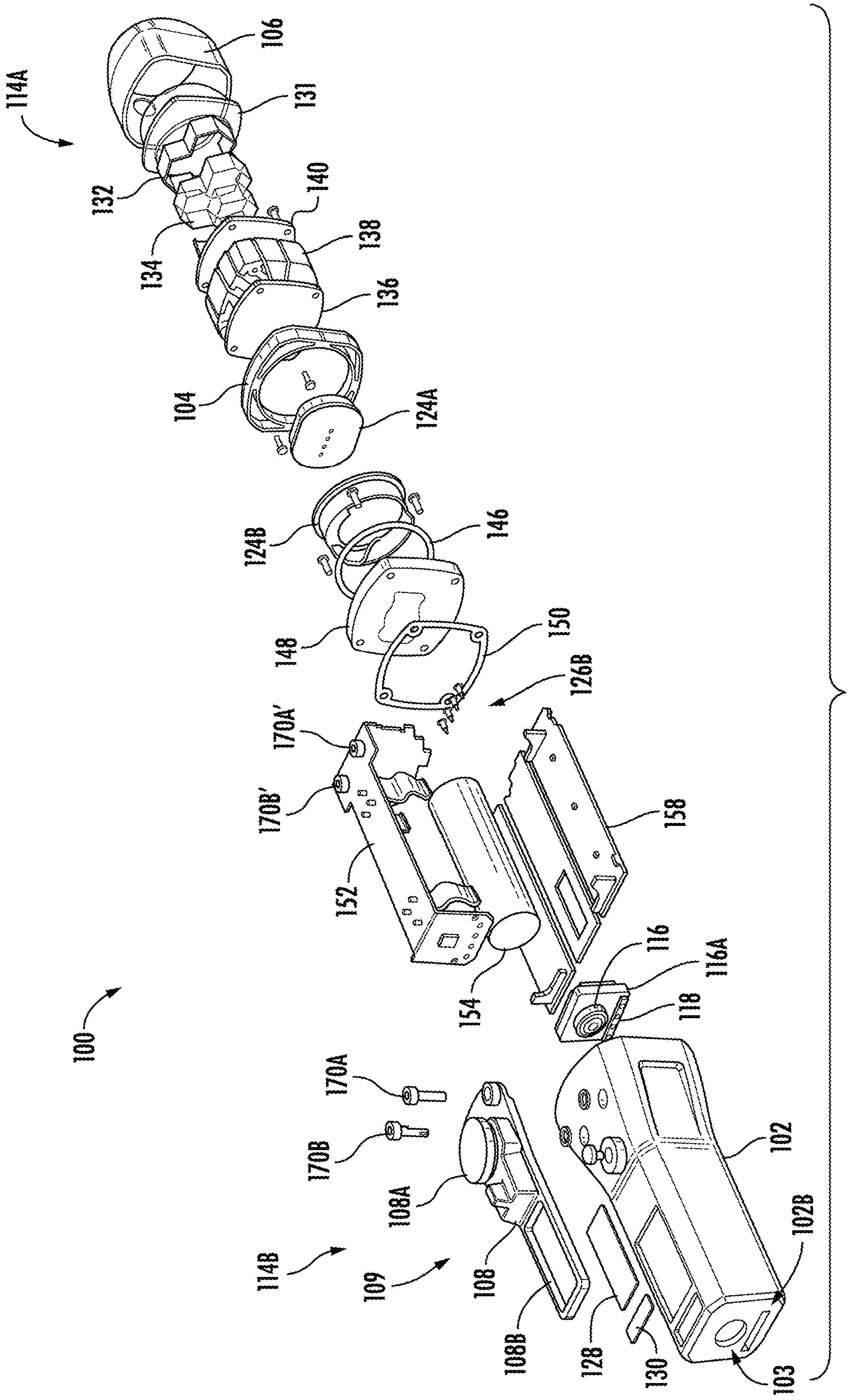
FIGS. 5A-5B are exploded views of the flashlight of FIG. 1A in accordance with an embodiment of the present invention.
Figure 5B:
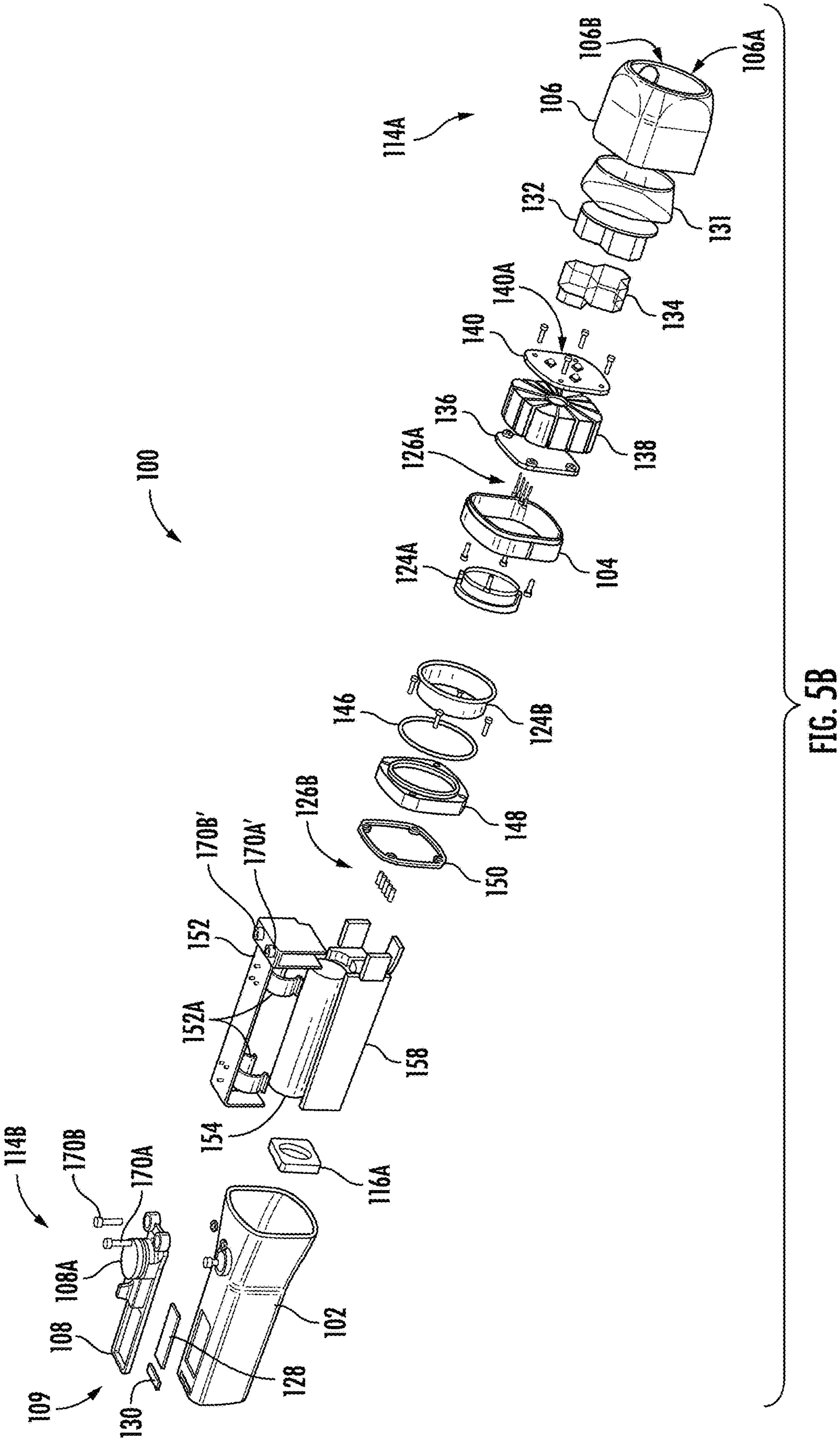

The example flashlight 100 is illustrated in exploded views in FIGS. 5A-5B and in cross-section in FIG. 6. Referring to these Figures, body 102 of flashlight 100 is provided in the form of a hollow shell that, in various embodiments, can have any suitable cross-sectional shape, or a cross-sectional shape that varies in the longitudinal direction. Body 102 can comprise a plastic material or a polyester resin material in some embodiments, though body 102 may comprise another material in other embodiments.

In this embodiment, body 102 also defines openings 102B and 103 that are sized to receive a switch assembly 116A that comprises the switch 116 and charge indicator 118 that are discussed above. As shown, switch assembly 116A is assembled within the body 102 so that the switch 116 extends through the opening 103 and so that charge indicator 118 extends through the opening 102B.

As is seen most easily in FIG. 5B, the head 106 is provided in the form of a hollow shell, also of any suitable cross-sectional shape, or a cross-sectional shape that varies in the longitudinal direction, with a central aperture extending therethrough. The head 106 is positioned at the first end 114A of flashlight 100. The indicator ring 104 is coupled with a proximal end of head 106, and at the distal end of head 106, the central aperture defines an opening 106A through which light from first light 120 is emitted. The head 106 also defines a second opening 106B on a lateral side of the head 106 through which light from second light 122 is emitted.

The flashlight 100 also comprises a light cover 131, which may be or comprise an optical element such as a lens, diffuser, or the like, or may simply be a transparent protective sheet through which light can pass and that serves to protect the light from damage. Light cover 131 in this embodiment has a flat front surface that, when light cover 131 is disposed within head 106, completely covers first opening 106A. Light cover 131 further comprises a depending skirt with peripheral dimensions that are complementary to, but slightly radially smaller than, the internal peripheral dimensions of head 106. Thus, when light cover 131 is disposed within head 106, the depending skirt fully covers the second opening 106B. The lens 131 may comprise a polycarbonate material in some embodiments, though any suitable material may be used.

Also disposed within head 106 in this embodiment is a first substrate 140 (e.g., a printed circuit board (PCB)) on which one or more light sources 140A are disposed. Light sources 140A, which together operate as first light 120, can be or comprise high-intensity light-emitting diodes (LEDs) in one embodiment, though other light sources could be used. As those of skill in the art will appreciate, first substrate 140 comprises circuitry that is configured to control light sources 140A (whether alone or in combination with another PCB or processing circuit in flashlight 100) and that is in electrical communication with other electrical components in head 106 and body 102, such as power source 154 and other electronic circuitry. Between substrate 140 and light cover 131 are one or more reflectors 134 that are mounted in a reflector bracket 132. In this embodiment, light sources 140A comprises three LEDs, and thus three reflectors 134 are provided. As shown in FIG. 5, reflectors 134 can be arranged in a honeycomb shape and each reflector can be disposed over a respective light source 140A. Reflector bracket 132 can be formed of an aluminum material, such as type II anodized aluminum.

Further, head 106 in this embodiment comprises a second substrate 136 (e.g., a PCB) on which one or more light sources (not shown) are disposed. These light sources likewise can be or comprise high-intensity LEDs in one embodiment, and they may together or separately be operative to illuminate indicator ring 104 as described herein. Second substrate 136 comprises circuitry that is configured to control the light sources thereon and also is in electrical communication with first substrate 140 and other electrical components in body 102. As shown in FIG. 6, second substrate 136 can be positioned at the proximal end of head 106 and can be received in a circumferential lip of indicator ring 104. The circumferential lip can, for example, have an interior diameter sized to snugly receive second substrate 136 and an outer diameter sized to be snugly received in the opening defined at the proximal end of head 106. As mentioned above, female member 124A also is carried in indicator ring 104 in this embodiment, and pins 126A can pass through female member 124A to be coupled with second substrate 136 and in electrical communication with the circuitry thereon. Also as mentioned above, to provide electrical communication between the circuitry in body 102 and head 106, pins 126A engage electrical contacts 126B that are disposed in and extend through sealing member 148. Electrical contacts 126B are coupled with a third substrate 152 that is also in electrical communication with power source 154.

In the illustrated embodiment, a mounting bracket 138 is disposed in head 106 between first and second substrates 140, 136 and substrates 140, 136 are mounted thereto using suitable fasteners. Mounting bracket 138 can also serve as a heat sink for cooling various light sources and may provide one or more longitudinal apertures through which first substrate 140 can communicate with second substrate 136 via suitable electrical wiring.

In various embodiments, flashlight 100 preferably is dust-proof and may be ATEX classified, for example, for use in Zones 0 through 20. In this regard, sealing member 148 preferably is snugly received in the opening defined at the distal end of body 104, and a sealing ring 150 can be disposed between sealing member 148 and body 102. A sealing ring 146 also can be provided between male member 124B and sealing member 148. When head 106 and body 102 are coupled together, as shown in FIG. 6, sealing ring 146 also is disposed interior of indicator ring 104. Sealing rings 146, 150 can be or comprise O-rings or the like and can be formed of or comprise an Ethylene Propylene Diene Monomer (EPDM) material in some embodiments.

As noted above, body 102 also contains a power source 154. In particular, power source 154 can be or comprise a battery, battery pack, capacitor, or other suitable power source in various embodiments. Where the power source 154 is a battery pack, the battery pack may be a lithium ion cell battery pack. In some embodiments, the power source 154 may replaceable. Power source 154 in this embodiment is received in a carrier 158 that defines a frame for supporting both power source 154 and third substrate 152 within body 102. As shown, carrier 158 surrounds power source 154 and provides slots configured to receive portions of third substrate 152 that extend perpendicularly to longitudinal axis A1, one of which is coupled with electrical contacts 126B. A longitudinal portion of third substrate 152 also can be received in a slot defined in carrier 158 or otherwise coupled with carrier 158. Carrier 158 may also serve as a heat sink for certain electrical components in some embodiments.

Again, power source 154 provides electrical power to the circuitry and other electrical components in body 102 and head 106 via third substrate 152. In this regard, power source 154 can be held in place relative to third substrate 152 via a pair of clamps 152A (FIG. 5B) and can be in electrical communication with third substrate 152 via suitable electrical contacts (FIG. 6). Third substrate 152 also has a portion that comprises an electrical button or switch that engages physical switch 116. Electrical contacts 170A, 170B also extend through body 102 so that they are in electrical communication with third substrate 152 at locations 170A' and 170B' and can route electrical power to power source 154 for charging. In some embodiments, third substrate 152 can contain the primary processing circuitry that operates flashlight 100 in response to user actuation of switch 116 and otherwise performs the functionality described herein.

Figure 7:
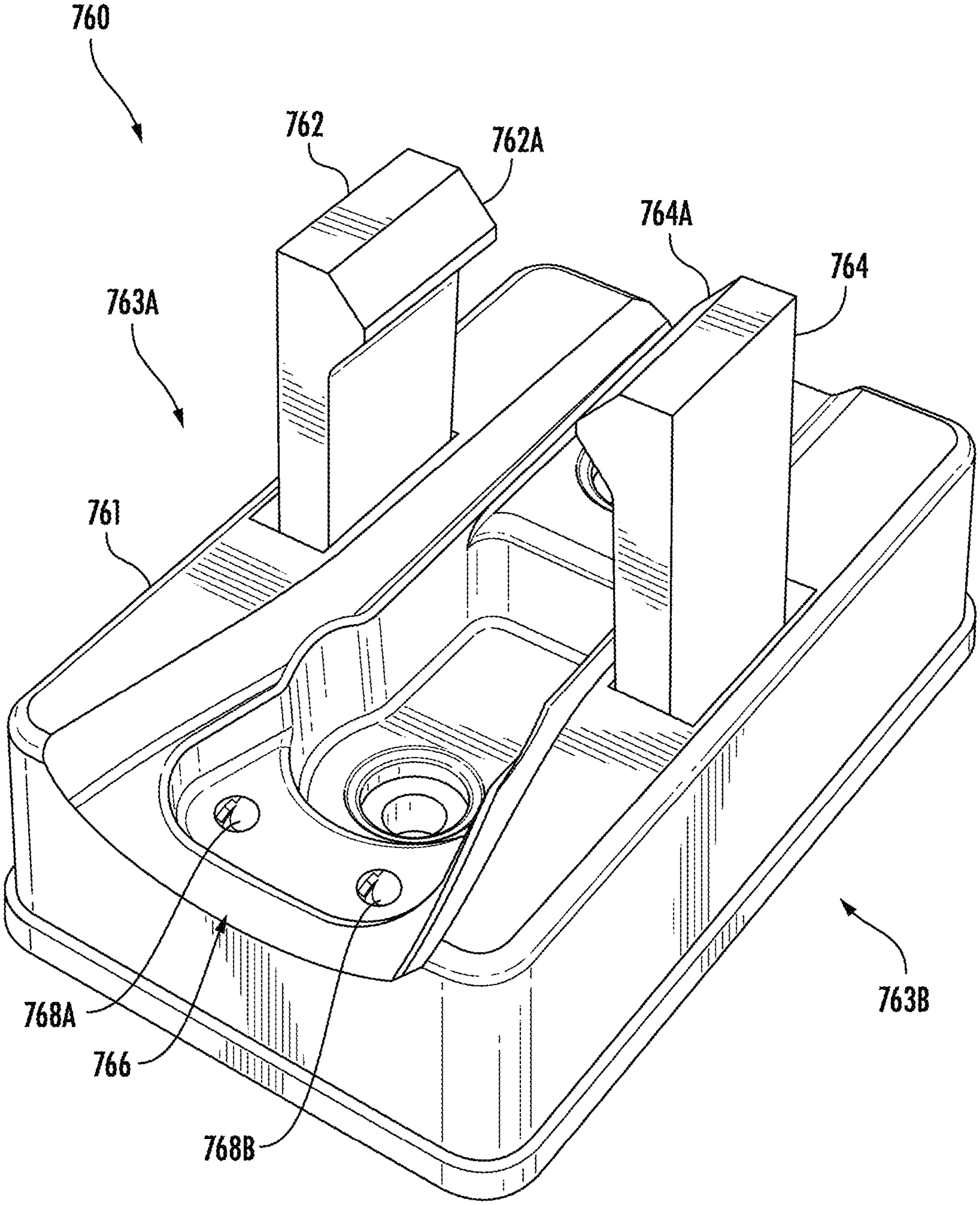
FIG. 7 is a perspective view of a charger unit in accordance with an embodiment of the present invention.

The example flashlight described above may be charged in various charger units, one example of which is illustrated in FIG. 7. In this regard, a charger unit 760 is configured to charge one flashlight at a time, but other charger units may be utilized that may charge multiple flashlights at a time. The charger unit 760 comprises a body 761. The body 761 defines a first lateral side 763A and a second lateral side 763B. The body 761 also defines a recess 766 where a flashlight may rest, with the recess 766 being positioned between the first lateral side 763A and the second lateral side 763B. Recess 766 may have peripheral dimensions that correspond to those of attachment member 108A of flashlight 100. Additionally, the charger unit 760 comprises electrical contacts 768A, 768B within the recess 766. When the flashlight 100 is received appropriately within the recess 766, the electrical contacts 170A, 170B of the flashlight 100 may come in contact with the electrical contacts 768A, 768B to allow electrical current to flow through each of the contacts and into the flashlight 100.

To assist in positioning a flashlight and in retaining a flashlight, the charger unit 760 comprises two arms 762, 764. The arm 762 is positioned on a first lateral side 763A, and the arm 762 comprises an extended portion 762A that extends from the arm 762 towards the second lateral side 763B. The arm 764 is positioned on a second lateral side 763B, and the arm 764 comprises an extended portion 764A that extends from the arm 764 towards the first lateral side 763A. Thus, the extended portions 762A, 764A both tend to extend over a flashlight when a flashlight is received within the recess 766.

Figure 8:
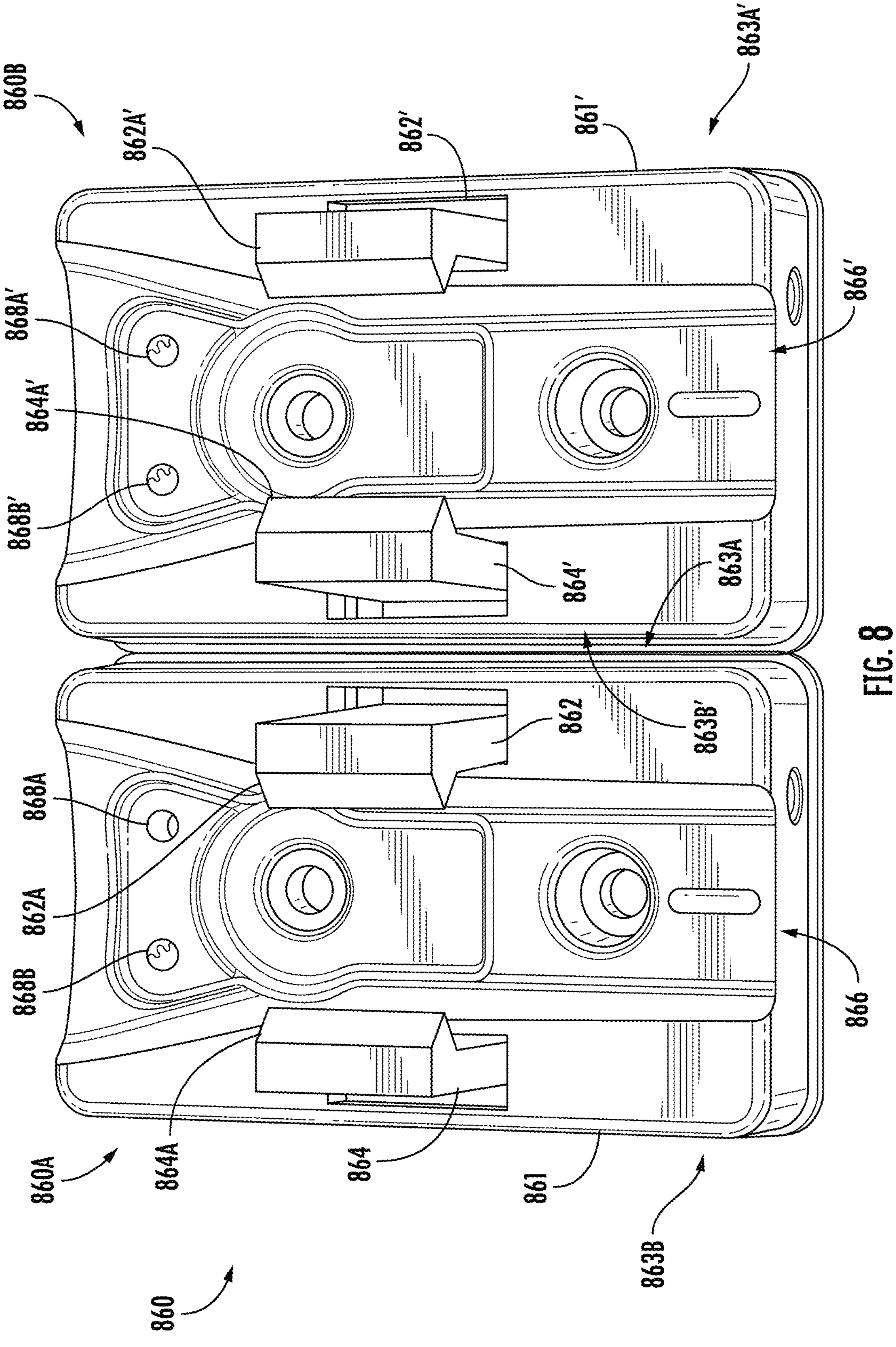
FIG. 8 is a perspective view of a charger unit in accordance with yet another embodiment of the present invention.

Turning now to FIG. 8, a charger unit 860 is provided with a first subunit 860A and a second subunit 860B, with each of the two subunits being configured to charge a respective flashlight 100. As shown, each of the subunits 860A and 860B are analogous to charger unit 760, described above, wherein like reference numerals denote like parts.

Figure 9:
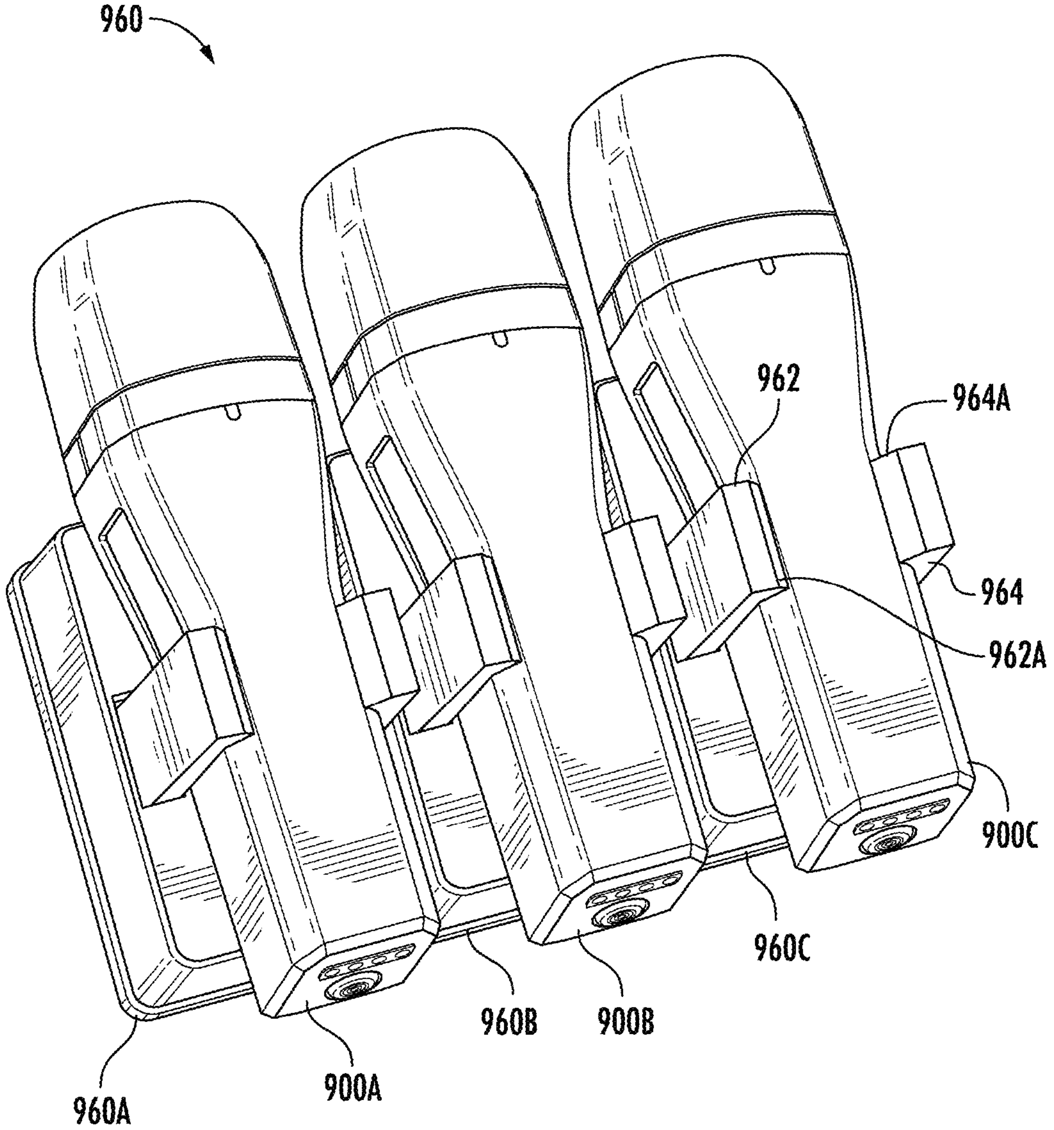
FIG. 9 is a perspective view of a charger unit in accordance with a further embodiment of the present invention wherein three flashlights are docked with the charger unit.

Referring now to FIG. 9, a charger unit 960 is provided with a first subunit 960A, a second subunit 960B, and a third subunit 960C, with each of the three subunits 960A-960B being configured to charge a respective flashlight of the flashlights 900A-900C. In FIG. 9, the first subunit 960A is actively being used to charge a first flashlight 900A, the second subunit 960B is actively being used to charge a second flashlight 900B, and the third subunit 960C is actively being used to charge a third flashlight 900C. Each of the subunits 960A-960C may have a structure that is similar to the subunits 860A, 860B of the charger unit 860 of FIG. 8, and each of the flashlights 900A-900C may be analogous to flashlight 100, described above. Each of the subunits 960A-960C comprise arms. For example, the third subunit 960C comprises arms 962, 964. These arms 962, 964 may also comprise extended portions 962A, 964A similar to other embodiments described herein.

Figure 10B:
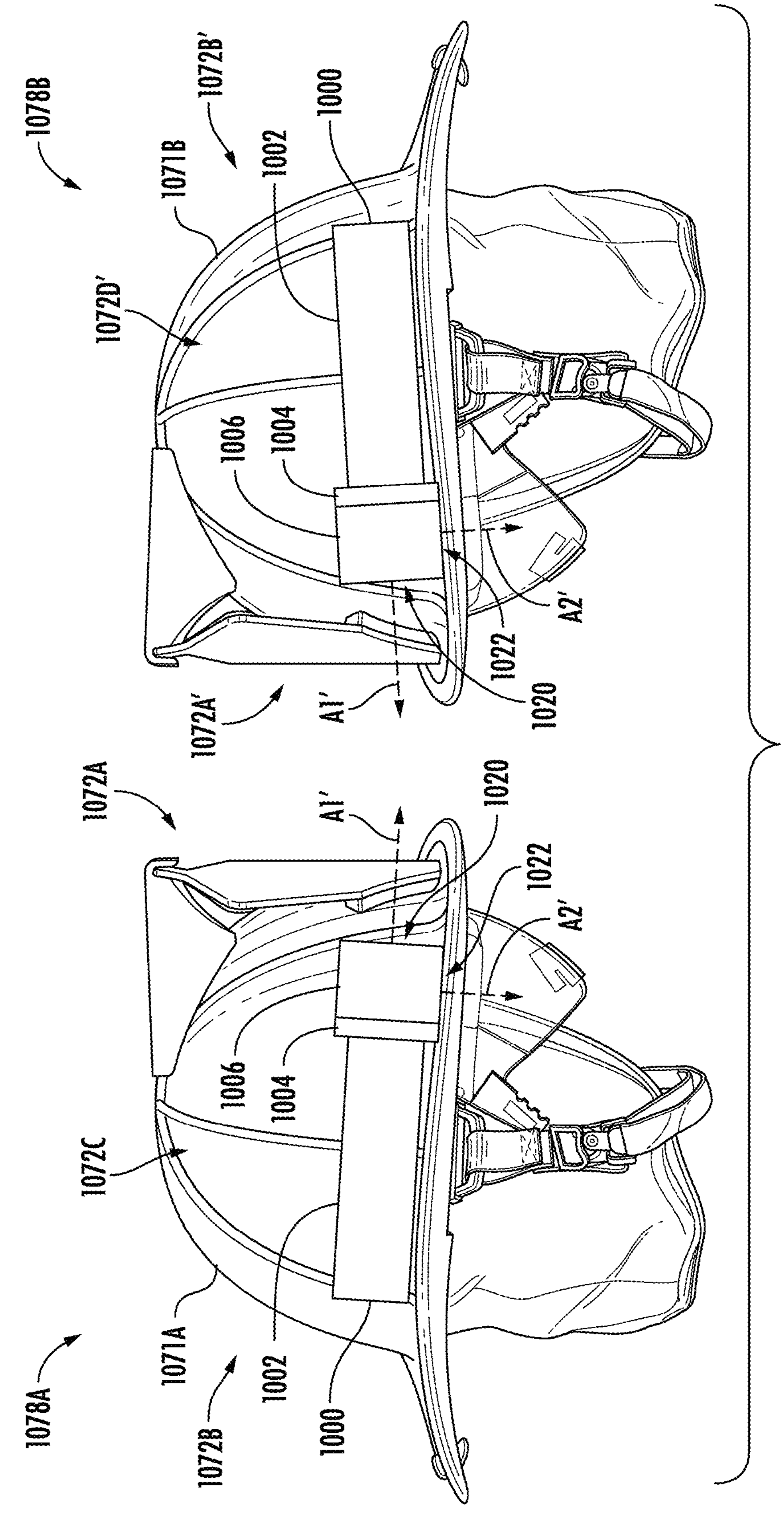
FIG. 10B is a schematic view of the helmet assemblies of FIG. 10A wherein flashlights are attached to the helmet assemblies.

FIG. 10A illustrates helmet assemblies 1078A, 1078B. The helmet assemblies 1078A, 1078B may also include the flashlights themselves in some embodiments as illustrated in FIG. 10B, but the flashlights are not shown in FIG. 10A so that brackets 1074A, 1074B may be seen. Referring first to helmet assembly 1078A, the helmet assembly 1078A has a helmet 1071A and a bracket 1074A. The bracket 1074A defines a recess 1076A that may be configured to receive a portion of an attachment member 108A of the flashlight 100 of FIG. 1, and the bracket 1074A may be configured to assist in attaching the attachment member 108A to the helmet 1071A. The helmet 1071A has a front portion 1072A, an occipital portion 1072B, a first lateral side 1072C, and a second lateral side (not shown) opposite the first lateral side 1072C. The first lateral side 1072C and second lateral side extend between the front portion 1072A and the occipital portion 1072B.

Helmet assembly 1078B has a helmet 1071B and a bracket 1074B. The bracket 1074B defines a recess 1076B that may be configured to receive a portion of an attachment member 108A of the flashlight 100 of FIG. 1, and the bracket 1074B may be configured to assist in attaching the attachment member 108A to the helmet 1071B. The helmet 1071B has a front portion 1072A', an occipital portion 1072B', a first lateral side (not shown), and a second lateral side 1072D' opposite the first lateral side. The first lateral side and second lateral side 1072D' extend between the front portion 1072A' and the occipital portion 1072B'.

In some embodiments, only one attachment bracket may be provided on a helmet. However, multiple attachment brackets may be provided on the helmet in other embodiments. For example, one attachment bracket may be positioned on a first lateral side 1072C of a helmet 1071A and another attachment bracket may be positioned on an opposite lateral side of a helmet 1071A, thereby allowing a flashlight to be attached to either side of the helmet 1071A. Attachment brackets may also be provided at other locations on the helmet in some embodiments.

In some embodiments, one or more attachment brackets may be selectively installed on a helmet in the desired position by a user. For example, an attachment bracket may be installed on a helmet through the use of one or more fasteners. These fasteners may include screws, nuts, bolts, adhesives, snaps configured to form snap fit engagements with a portion of the helmet, etc.

FIG. 10B illustrates helmet assemblies 1078A, 1078B with a flashlight 1000 attached to the helmets 1071A, 1071B using attachment brackets. The flashlight 1000 comprises a body 1002, an indicator ring 1004, and a head 1006. These features and other features of the flashlight 1000 may be similar and/or identical to the corresponding features of flashlight 100 described above.

In helmet assembly 1078A, the flashlight 1000 is attached to the helmet 1071A with the flashlight 1000 positioned on the first lateral side 1072C of the helmet 1071A. The flashlight 1000 is oriented such that the first light 1020 on the head 1006 is directed along axis A1', with the first light 1020 being directed in a forward, or anterior, direction relative to the helmet 1071A and away from the occipital portion 1072B of the helmet 1071A. Additionally, the head 1006 is attached on the flashlight 1000 in a first position. When the head 1006 is in this first position, the second light 1022 is oriented downwardly along axis D1'. The head 1006 may be selectively attachable to the body 1002 such that first light faces an anterior direction and the second light faces an inferior direction when the attachment feature is attached to either the first lateral side 1072C of the helmet 1071A or the second lateral side of the helmet 1071A.

In helmet assembly 1078B, the flashlight 1000 is attached to the helmet 1071B with the flashlight 1000 positioned on the second lateral side 1072D' of the helmet 1071B. The flashlight 1000 is oriented such that the first light 1020 on the head 1006 is directed along axis A1', with the first light 1020 being directed in a forward direction relative to the helmet 1071B and away from the occipital portion 1072B' of the helmet 1071B. Additionally, the head 1006 is attached on the flashlight 1000 in a second position, with this second position being different from the first position of the head 1006 in the helmet assembly 1078A. When the head 1006 is in the second position, the second light 1022 is oriented downwardly along axis D2'. The head 1006 may be selectively attachable to the body 1002 such that first light faces an anterior direction and the second light faces an inferior direction when the attachment feature is attached to either the first lateral side of the helmet 1071B or the second lateral side 1072D' of the helmet 1071B.

By allowing the head 1006 to be selectively attachable in the first position and/or the second position, the second light 1022 may be generally directed in a downward direction regardless of the side of a helmet where a flashlight is attached. Without the ability to selectively attach the head 1006, light at the second light 1022 may be emitted downwardly when the flashlight 1000 is in the first position illustrated in the helmet assembly 1078A, but the light at the second light would then be emitted upwardly when the flashlight 1000 is in the second position illustrated in the helmet assembly 1078B. Alternatively, light at the second light 1022 may be emitted downwardly when the flashlight 1000 is in the second position illustrated in the helmet assembly 1078B, but the light at the second light would then be emitted upwardly when the flashlight 1000 is in the first position illustrated in the helmet assembly 1078A.

Figure 11:
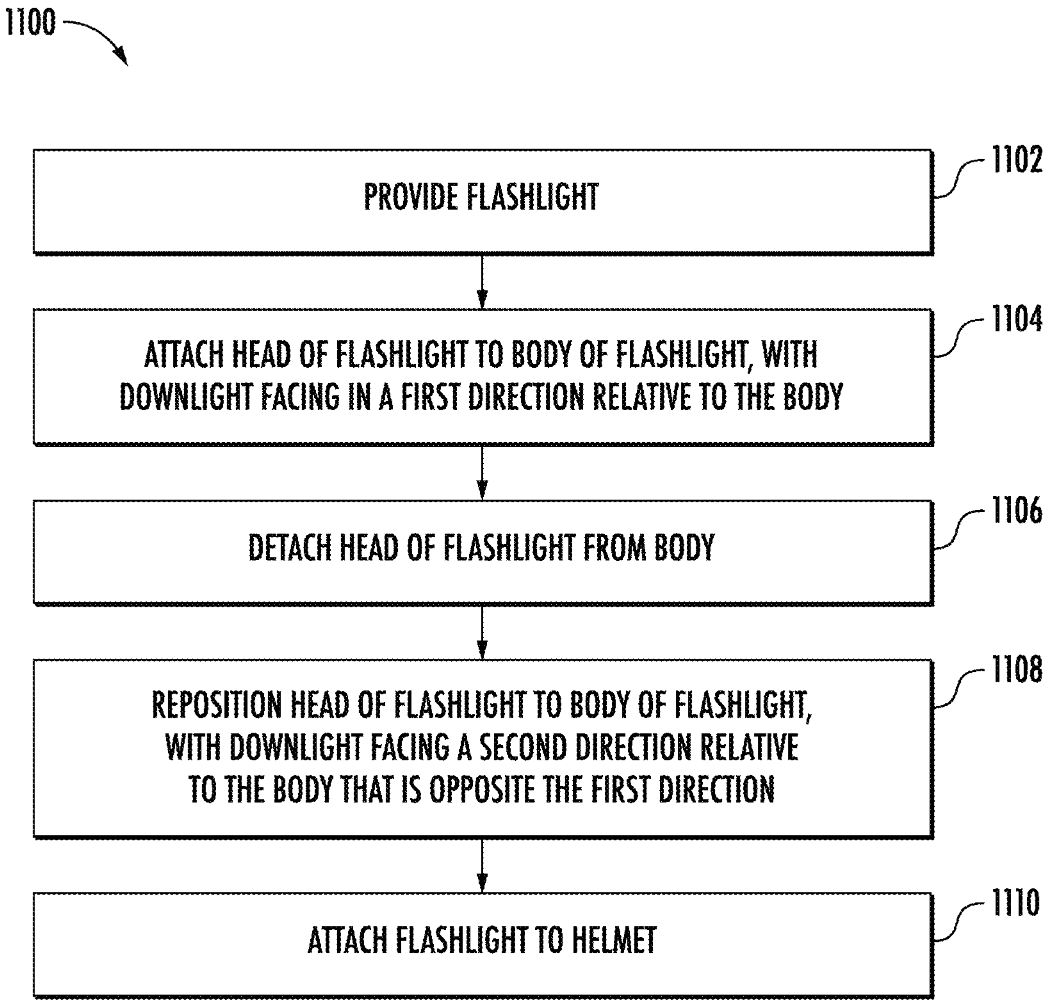
FIG. 11 is a flow chart illustrating an example method for using a flashlight in accordance with an embodiment of the present invention.

Methods of using a flashlight are also contemplated. FIG. 11 illustrates an example method 1100 for using a flashlight, such as one of flashlights 100, 1000 described above. At operation 1102, a flashlight is provided. The flashlight comprises a body, and the body defines a longitudinal axis. The flashlight also comprises a head that is selectively attachable to the body. The head comprises a first light defining a first axis parallel to the longitudinal axis and a second light defining a second axis perpendicular to the longitudinal axis.

At operation 1104, the head of the flashlight is attached to the body of the flashlight in a first position. In this first position, the second light faces a first direction relative to the body. Attachment of the head of the flashlight to the body of the flashlight may be completed, for example, using the fitting described above including the female member 124A and male member 124B. The flashlight may be used for some period of time when the head is in this first position, or the flashlight may not be used at all when the head is in this first position. When the head is in this first position, the flashlight may be attached to a helmet so that the second light 122 (see FIG. 1A) is generally directed downwardly.

At operation 1106, the head of the flashlight may be detached from the body of the flashlight. Detachment of the head of the flashlight from the body of the flashlight may be completed in the manner described above with reference to FIGS. 1A-1B and 4A-4C. In other embodiments, depending on the method by which the head of the flashlight is releasably coupled with the body, the head may not be detached from the body and the head may instead be rotated direction from the first position to a second position.

At operation 1108, the head to the body may be repositioned in a second position. In this second position, the second light faces a second direction relative to the body that is opposite the first direction. Attachment of the head of the flashlight to the body of the flashlight may be completed using the alignment member 124A and fitting 124B as described herein. The flashlight may be used for some period of time when the head is in this second position, or the flashlight may not be used at all when the head is in this second position.

At operation 1110, the flashlight may be attached to a helmet. This attachment may occur when the head of the flashlight is in the second position so that the second light 122 (see FIG. 1A) is generally directed downwardly.

The method 1100 is merely provided as an example, and the method 1100 may be modified in various ways. Additional operations may be added to the method 1100. For example, the flashlight may be attached to a helmet when the head of the flashlight is in the first position. Certain operations may also be omitted from the method 1100. For example, operation 1106 may be omitted in some embodiments, and the head may simply be repositioned to the second position without detaching the head of the flashlight from the body. Additionally, the order of the operations for method 1100 may be altered, and certain operations of method 1100 may be performed simultaneously.

In accordance with various embodiments, the flashlights described herein can be used in various hazardous locations, such as but not limited to explosive gas atmospheres. For example, flashlights in accordance with embodiments of the present invention may comply with ATEX directive 2014/34/EU, among other standards, and be intrinsically safe for certain ATEX temperature classes including at least T1, T2, T3, and T4. These temperature classes include gases having auto-ignition temperatures greater than or equal to 450° C., 300° C., 200° C., and 135° C., respectively. Thus, in other words, the maximum surface temperature of the flashlights described herein during use at ambient temperatures from −20 to 40° C., including their electrical circuitry and power sources, can be less than or equal to 134° C. This ensures they can be safely used in environments containing gases with auto-ignition temperatures higher than that maximum surface temperature. This can be tested, for example, with regard to a power source such as a battery via an external short-circuit test that simulates improper or incorrect battery use.

In this regard, flashlight embodiments in the present disclosure can be provided with or include a power source assembly that is configured to remove or dissipate heat generated during use of the flashlight. The use of such power source assemblies enables the flashlights described herein to be powered by power sources, such as batteries, that would not otherwise qualify for use in certain hazardous environments by themselves. For instance, a given battery cell by itself may have a surface temperature reaching or exceeding 135° C. during an external short circuit test, but its maximum surface temperature may be less than 135° C. during the same test when used as part of a power source assembly as described herein because one or more components of the power source assembly may remove or dissipate sufficient heat therefrom. Among other things, this makes more battery cells from more manufacturers available for use with embodiments of the present invention that require certification for use in certain hazardous environments.

Figure 12A:
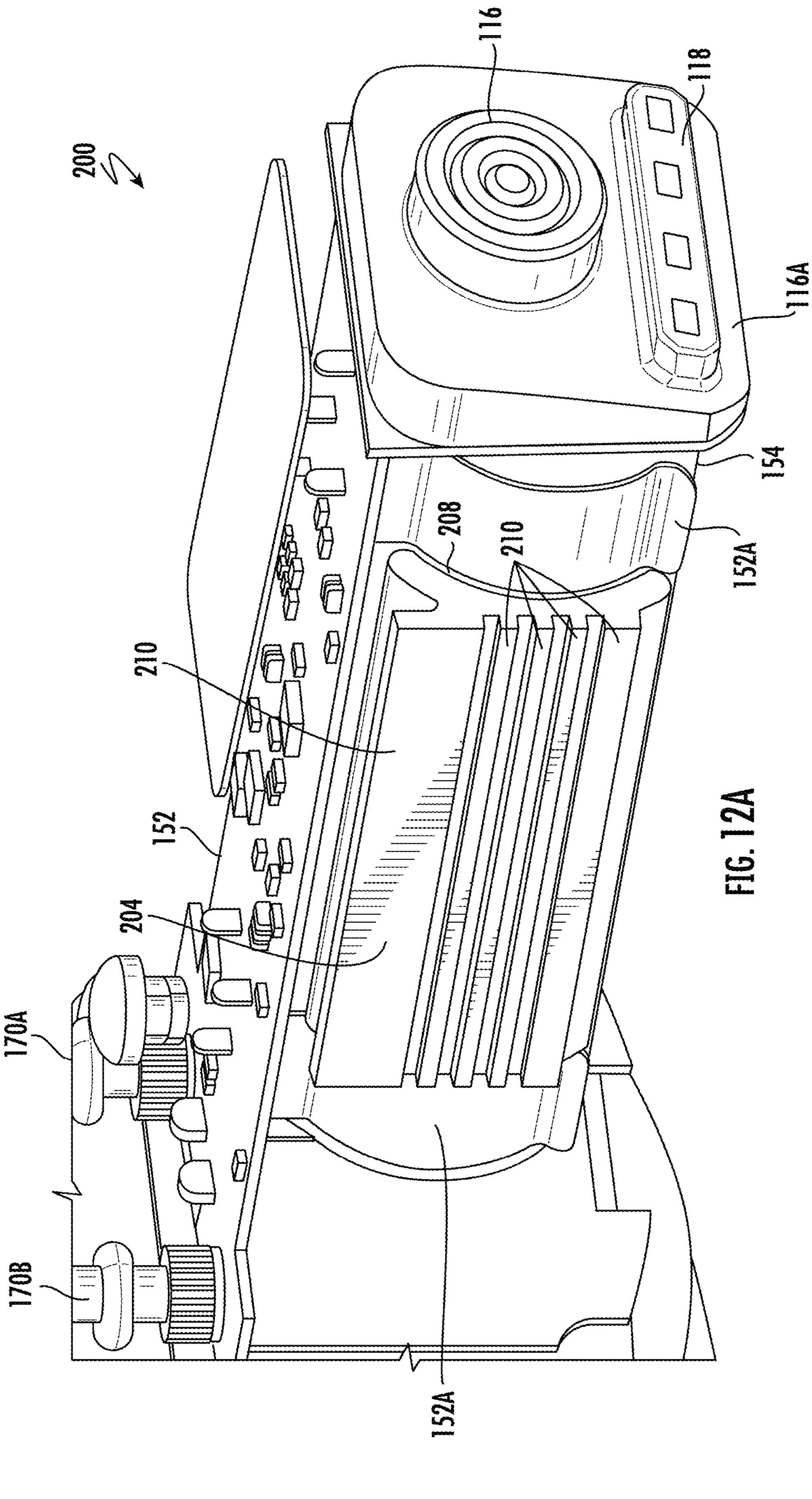
FIG. 12A is a side perspective view of a flashlight power source assembly including a heat sink in accordance with yet another embodiment of the present invention.
Figure 12B:
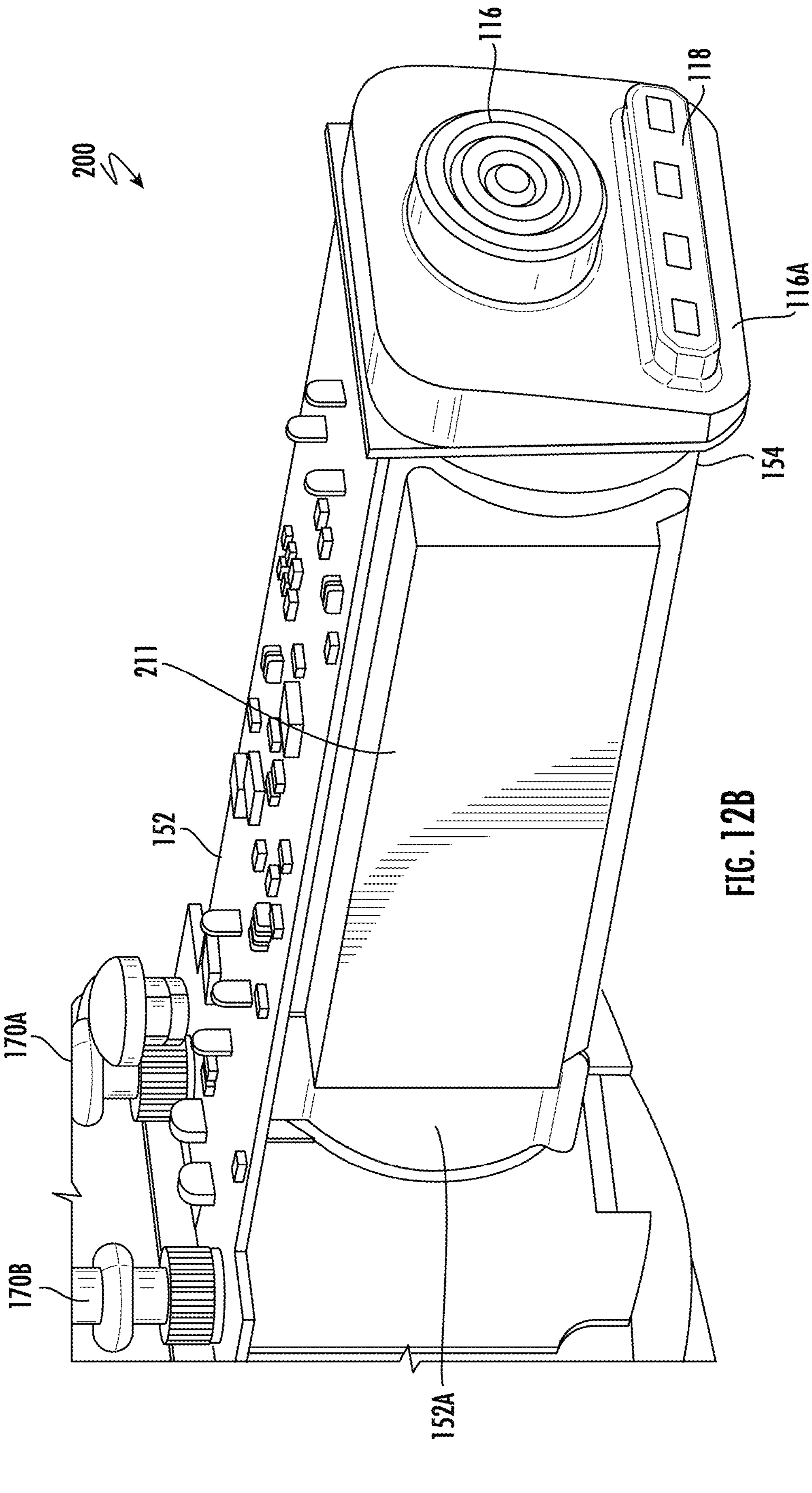
FIG. 12B shows an alternate embodiment of the flashlight power source assembly of FIG. 12A.
Figure 13:
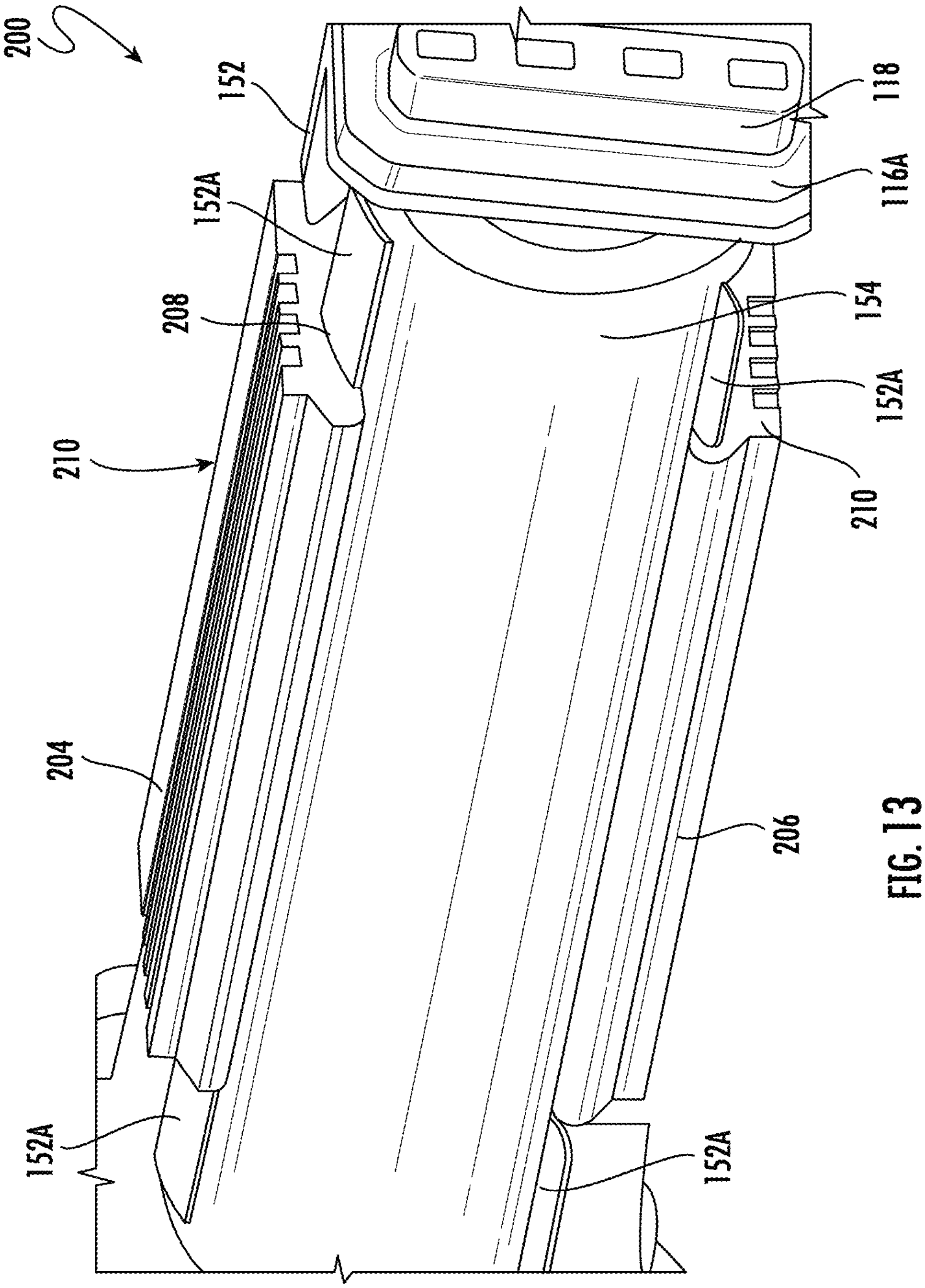
FIG. 13 is a bottom perspective view of the flashlight power source assembly of FIG. 12A.
Figure 14:
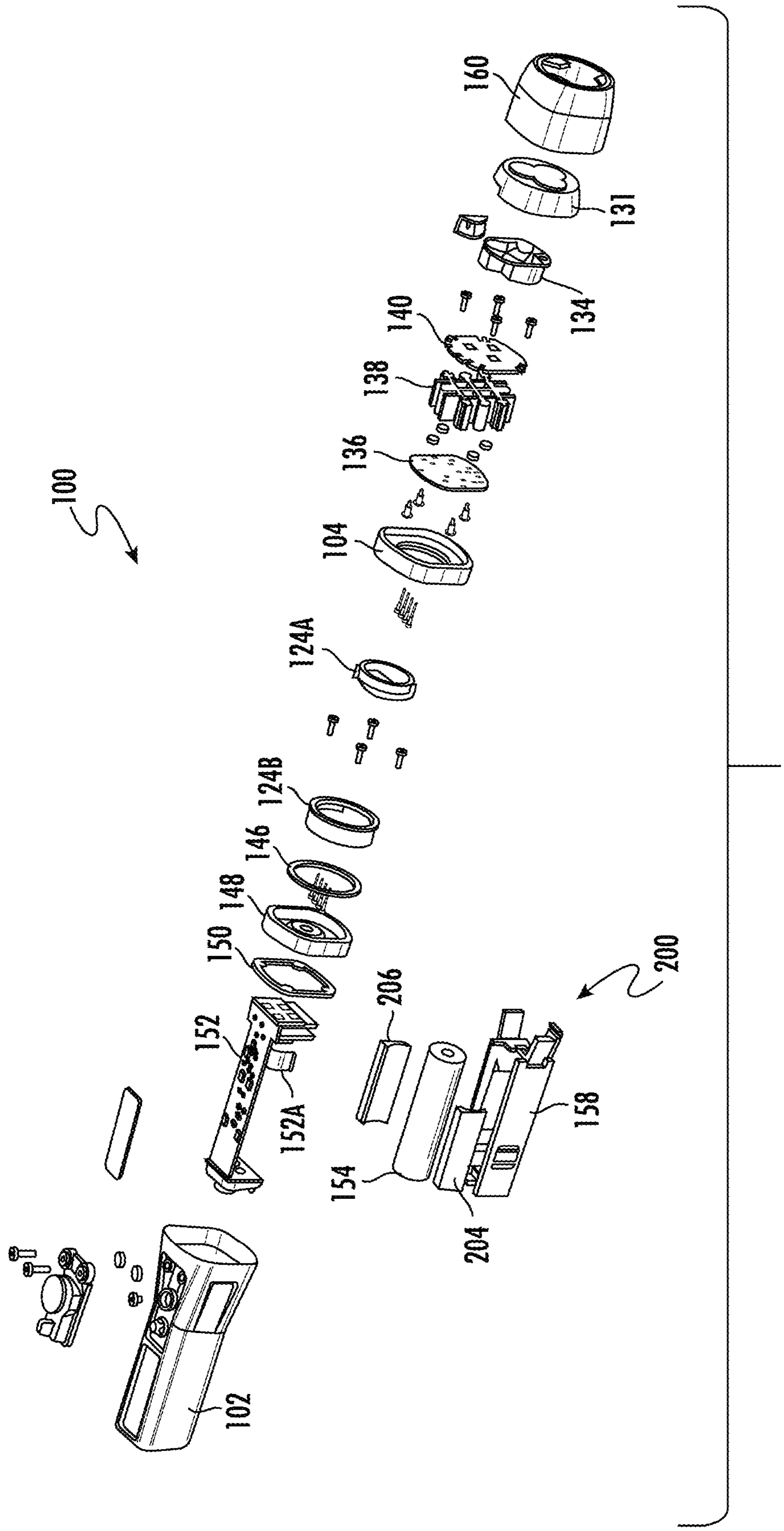
FIGS. 14-15 are exploded views of the flashlight of FIG. 1A including the power source assembly of FIG. 12B in accordance with an embodiment of the present invention.
Figure 15:
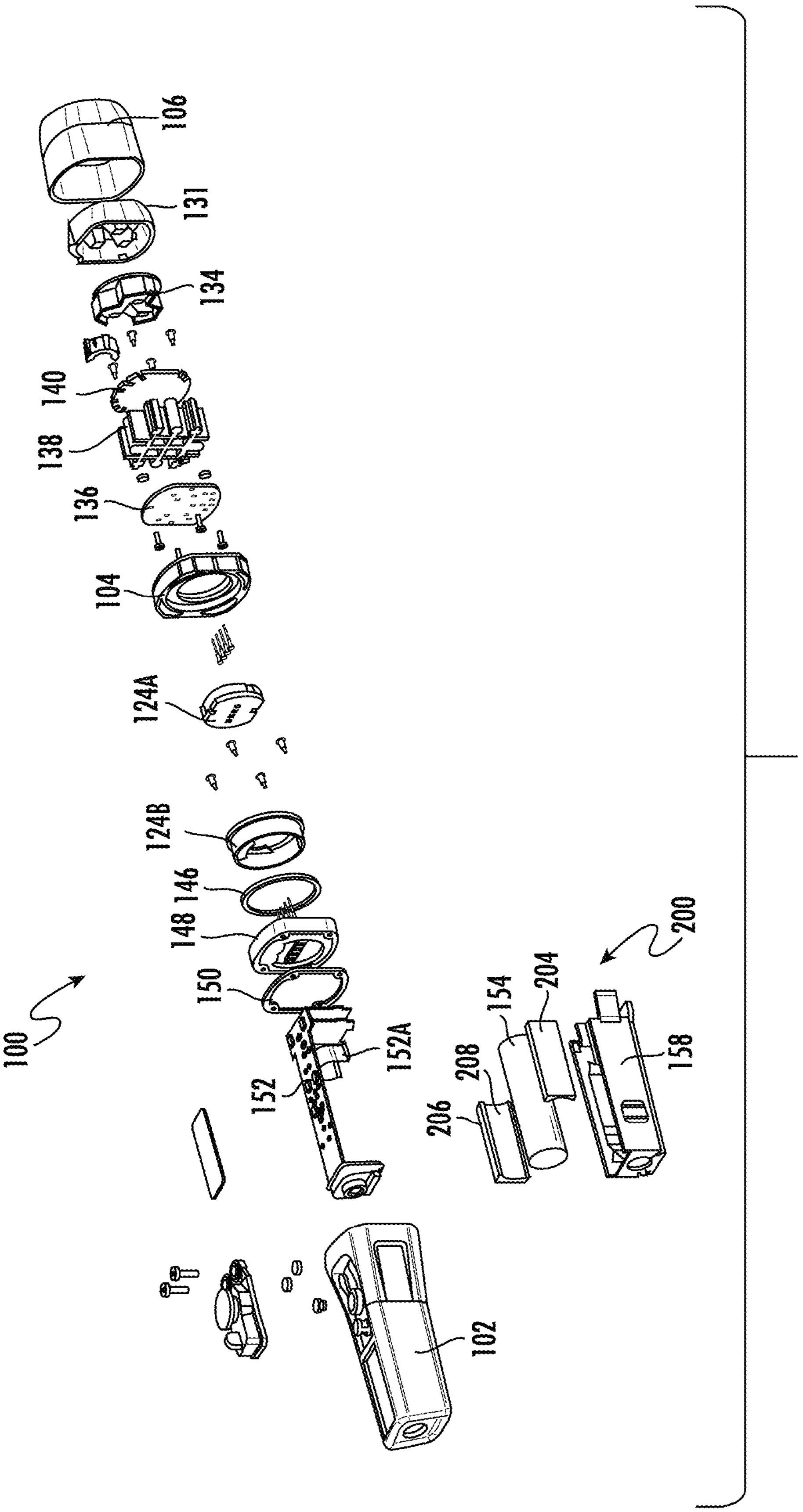
Figure 16:
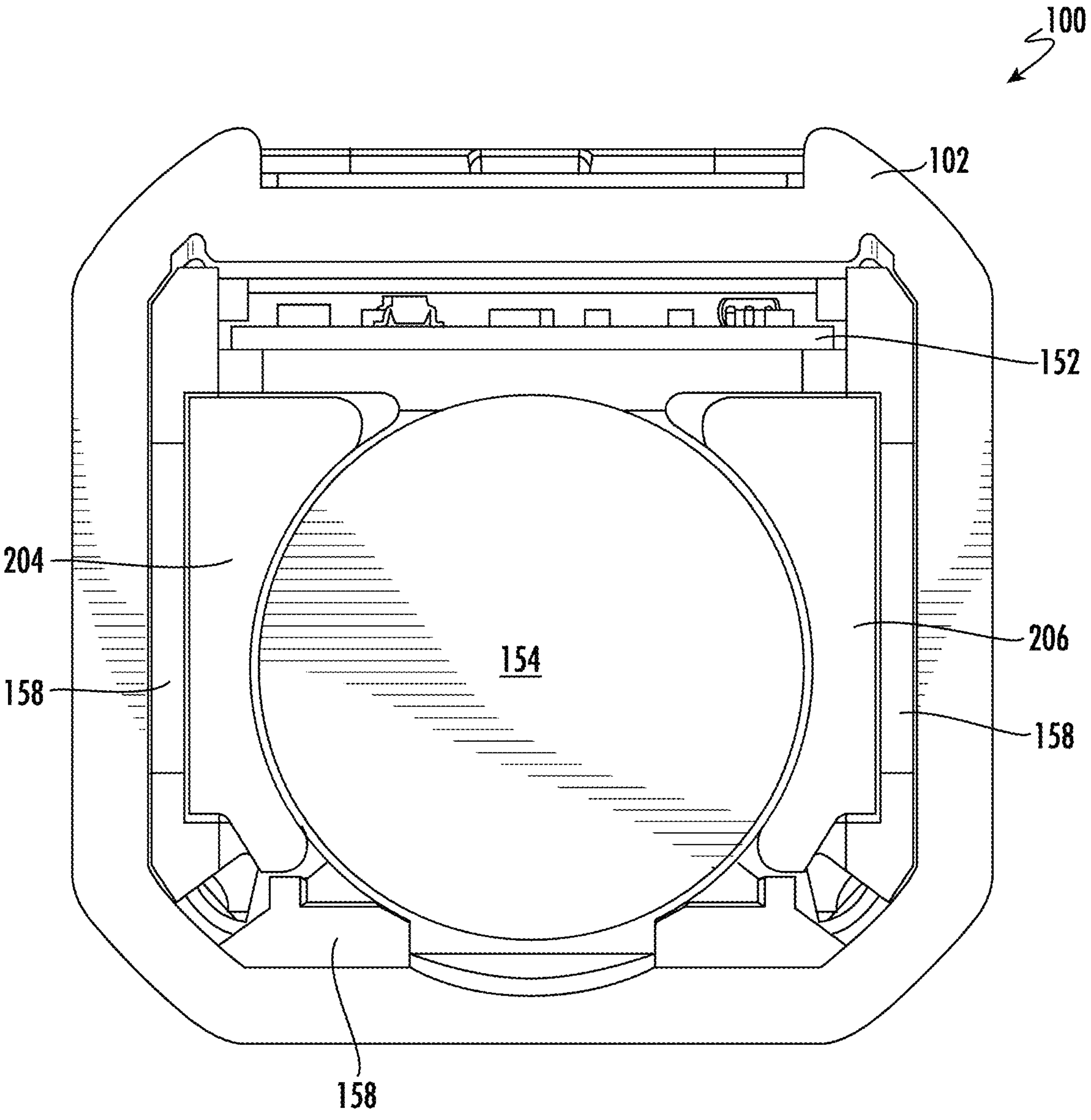
FIG. 16 is a cross-sectional view of the assembled flashlight of FIGS. 14-15 taken along a line through the power source assembly.

Several example embodiments are described with reference to FIGS. 12A-20 below, in which like reference numerals are used to denote like parts of flashlight 100 from FIGS. 1A-6 described above. Although example embodiments are described below with reference to flashlight 100, it will be appreciated that power source assemblies as described herein can be used with any flashlight needed to be used in hazardous locations and/or explosive atmospheres. Referring first to FIGS. 12A-13, a power source assembly 200 is shown in side and bottom perspective views. FIGS. 14-15 show exploded views of flashlight 100 including power source assembly 200, and FIG. 16 is a section view of flashlight 100 taken along a line through power source assembly 200.

In various embodiments described above, flashlight 100 comprises a carrier 158 and a third substrate 152 that support a power source 154, such as but not limited to a battery. For instance, power source 154 can be held in place relative to third substrate 152 via one or more clamps 152A. Switch assembly 116A is operably coupled with these components and is actuatable to turn flashlight 100 on and off, among other things.

In the embodiment shown in FIGS. 12A-16, power source assembly 200 comprises the power source 154 and a heat sink 202 comprising a pair of panels 204, 206 disposed on opposing lateral sides of power source 154. Panels 204, 206 can be attached directly to power source 154 using a suitable adhesive material, such as thermal paste. Panels 204, 206 in this embodiment may be an extrusion formed from a suitable thermally conductive metal material, such as aluminum. As shown, panels 204, 206 in this embodiment define an inner surface 208 that may be complementary in shape to the side of the power source 154 to which it will be attached (e.g., it may define a suitable curved shape where power source 154 is circular in cross-section). Further, panels 204, 206 comprise a plurality of fins 210 defined on an outer surface thereof in the embodiment of FIG. 12A. However, fins 210 are not required in all embodiments, as shown for instance in FIGS. 12B and 14-15. In the embodiment of FIG. 12B, for example, panels 204, 206 can be formed of solid aluminum and have substantially flat lateral faces 211.

Figure 17:
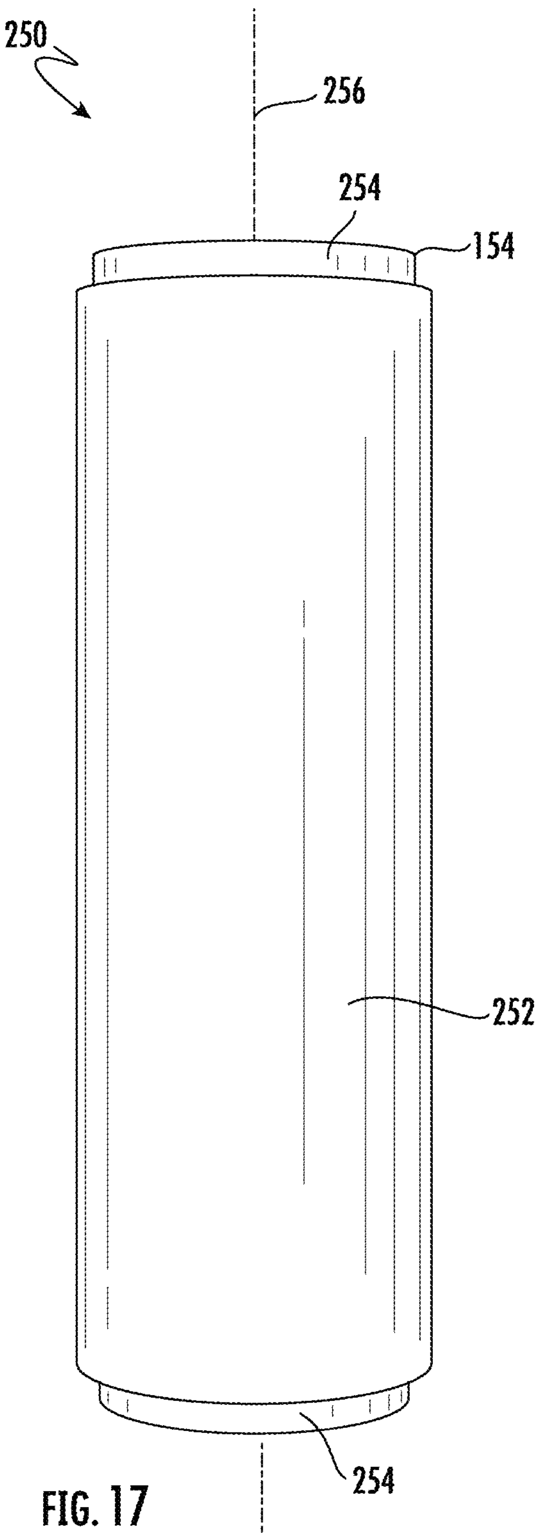
FIG. 17 is an elevation view of a power source assembly in accordance with yet another embodiment of the present invention.
Figure 18:
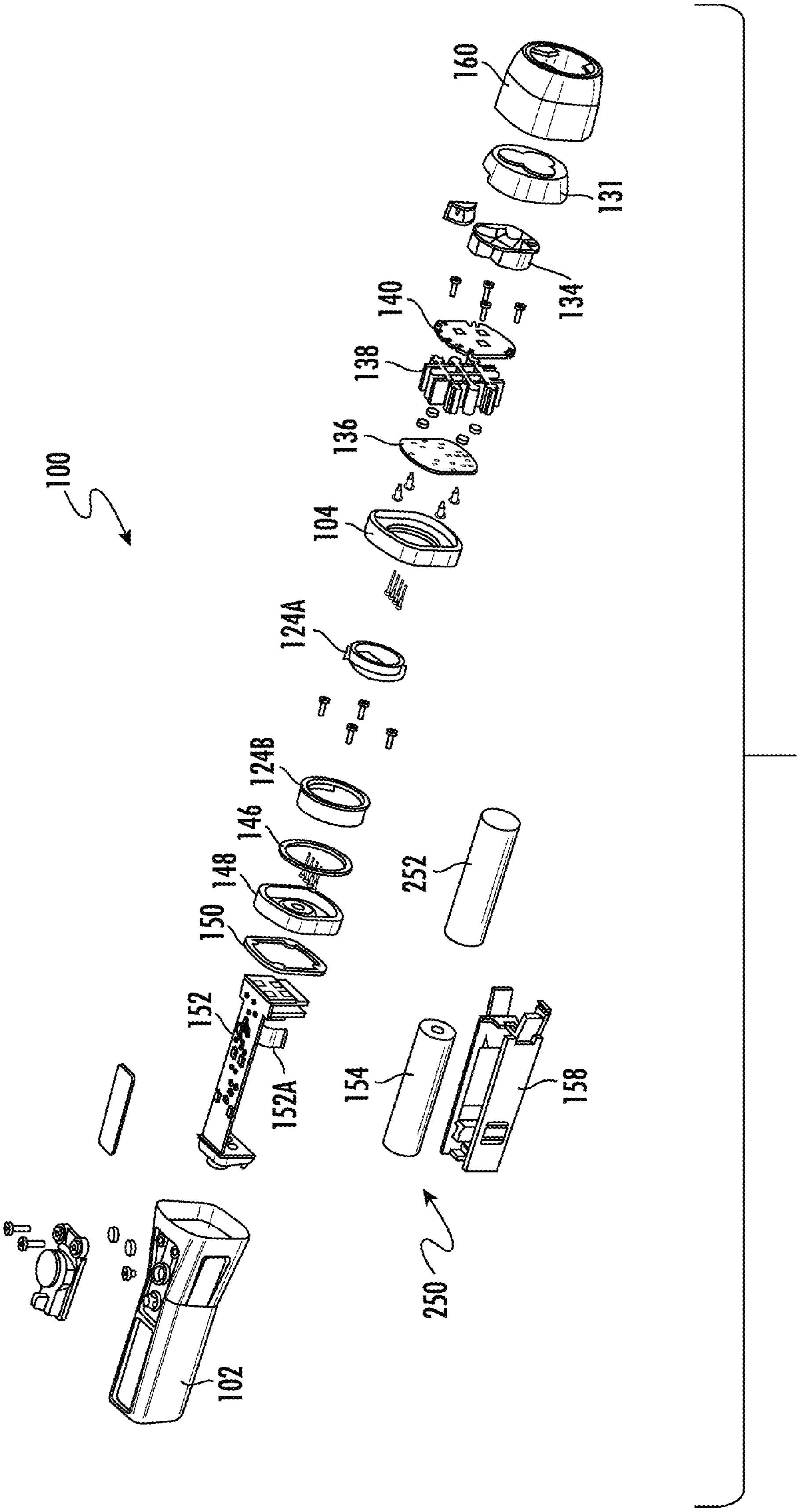
FIGS. 18-19 are exploded views of the flashlight of FIG. 1A including the power source assembly of FIG. 17.
Figure 19:
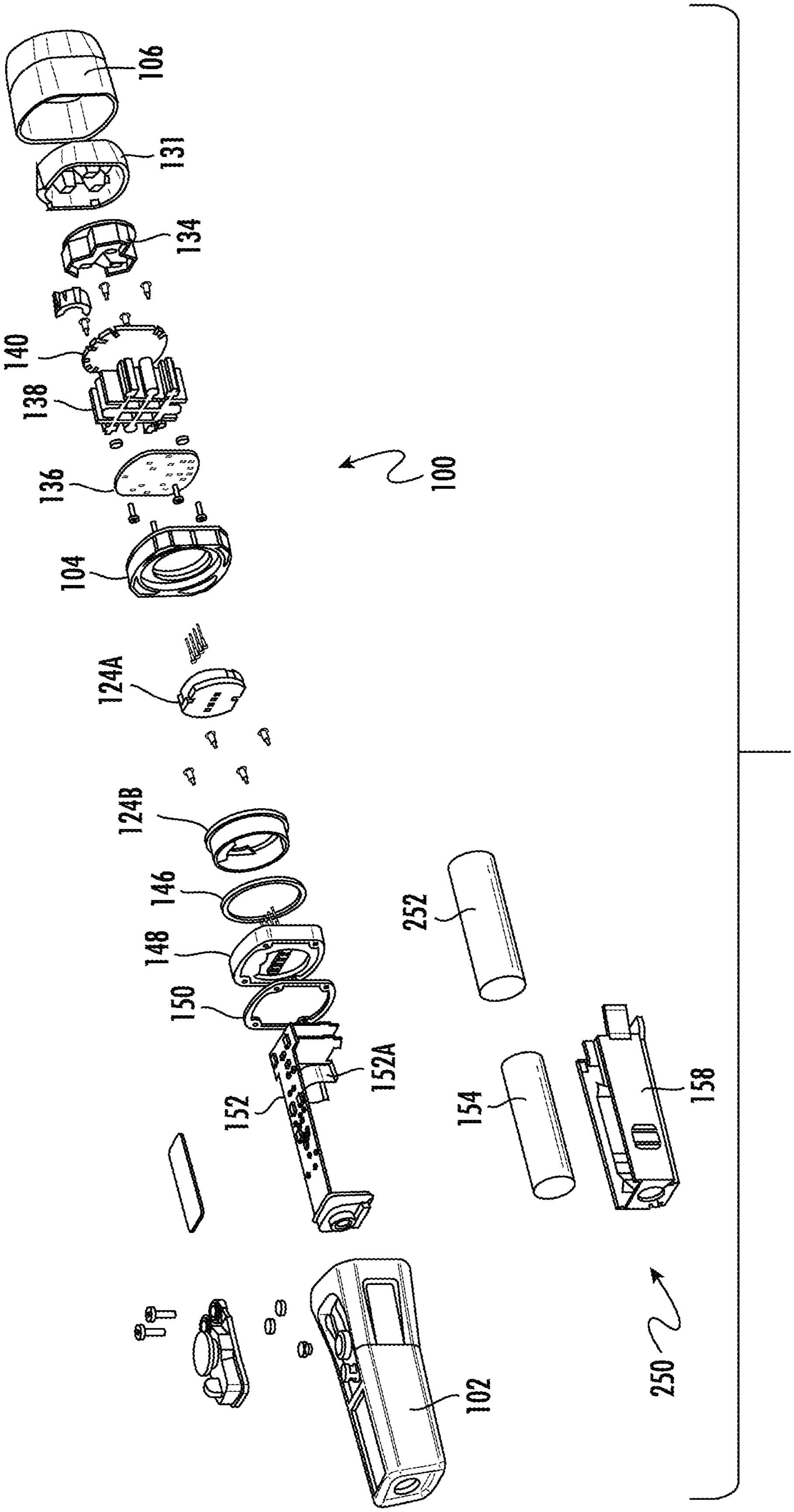
Figure 20:
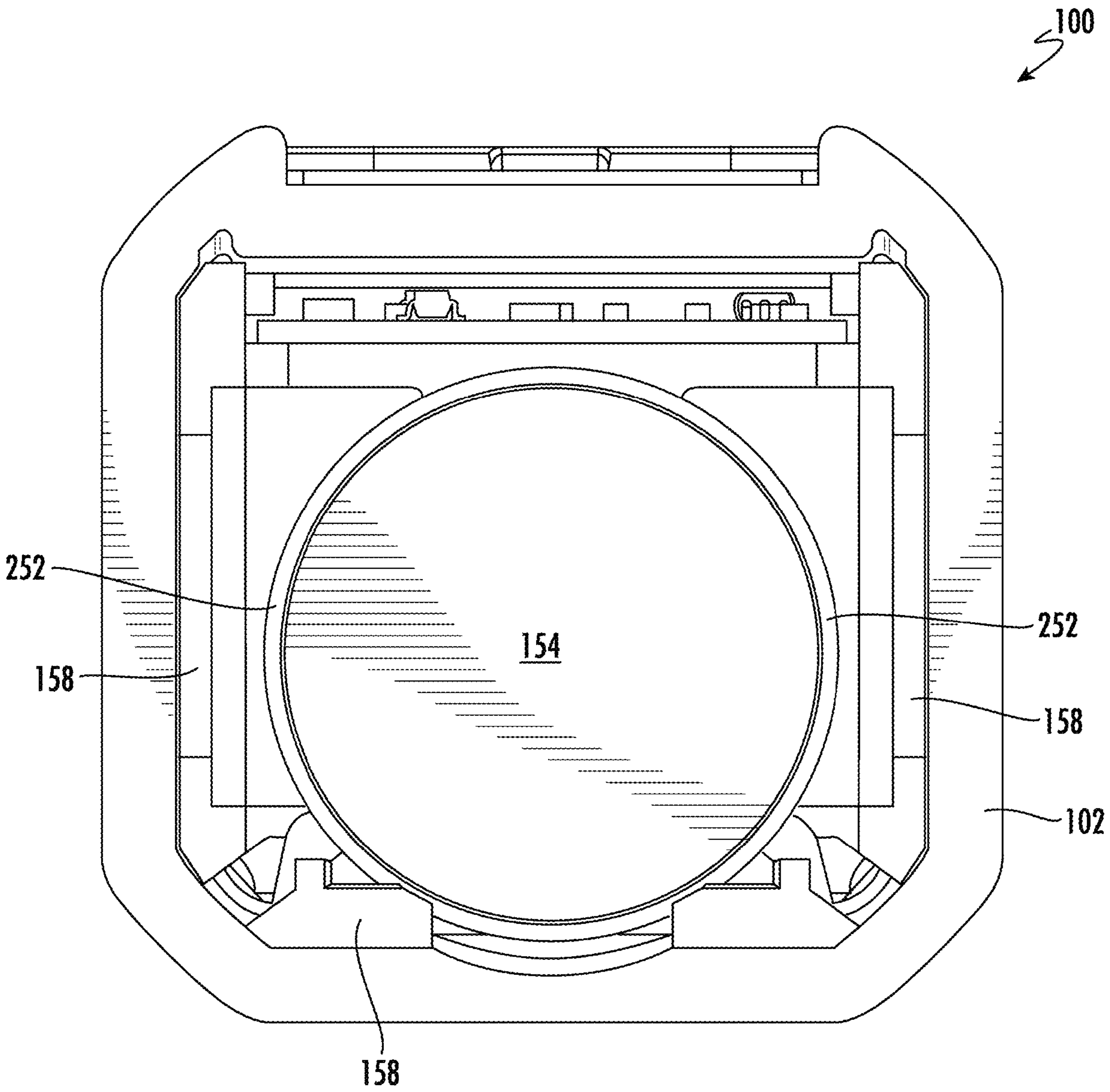
FIG. 20 is a cross-sectional view of the assembled flashlight of FIGS. 18-19 taken along a line through the flashlight power source assembly.

In accordance with another embodiment, FIG. 17 is an elevation view of a power source assembly 250. FIGS. 18-19 are exploded views of flashlight 100 including power source assembly 250. FIG. 20 is a cross-sectional view of flashlight 100 taken along a line through power source assembly 250.

In general, power source assembly 250 comprises power source 154 and a heat sink 252. Here, heat sink 252 is disposed over all or a portion of an exterior surface 254 of power source 154. Such heat sink(s) preferably surround at least a significant portion of power source 154 and thus may have an interior shape that is complementary to the exterior shape of power source 154. As shown, heat sink 252 is formed as an open cylinder, such as a sleeve or tube or shroud, in this embodiment because the exterior surface 254 of power source 154 is cylindrical in this example, but that is not required. Heat sink 252 can take any shape suitable for removing sufficient heat from power source 154 in various embodiments in order to allow use of power source 154 and flashlight 100 in a desired hazardous environment. In various embodiments, heat sink 252 also can comprise fins, e.g., analogous to those shown in FIGS. 12A and 13 above.

Also, in various embodiments, more than one such heat sink 252 can be disposed over different respective portions of power source 154 and/or one or more heat sink(s) 252 can be disposed over more than one power source 154 (e.g., where they are grouped together as a pack). The at least one heat sink 252 can extend along (and can be disposed about or in some cases coaxial with) a longitudinal axis 256 of power source(s) 154. The heat sink(s) 252 may cover the entire length dimension of power source(s) 154 or, as shown, may be shorter in length than the length dimension of power source(s) 154. In some embodiments, heat sink(s) 252 can also extend over a portion of either the base or the top surfaces of power source(s) 154. Those of skill in the art can select suitable dimensions of heat sink(s) 252 for the particular application and power source(s) 154.

In various examples where power source 154 is a battery, power source 154 can be, for instance, a lithium-ion battery cell having size 18650 or 21700 and a nominal capacity of between about 2500 mAh and 3000 mAh or between about 4000 mAh and 5000 mAh, respectively. Power source 154 also can comprise or be surrounded by a shrink wrap material, and in some embodiments heat sink(s) 252 can be disposed exterior of such shrink wrap material.

In the embodiment shown, heat sink 252 is formed from a suitable thermally conductive metal material, such as aluminum. Heat sink 252 can be formed by any suitable process, such as stamping, casting, or extrusion. In one embodiment, heat sink 252 is press-fit onto exterior surface 254, though that is not required. In some cases, there may be an air gap (e.g., of about 0.1 to about 0.5 mm) between exterior surface 254 and heat sink 252 due to tolerances in battery cell diameter. In other embodiments, heat sink 252 can be welded onto power source 154 or attached to power source 154 in another manner suitable for facilitating heat removal from power source 154. In some embodiments, thermal paste may be used in power source assembly 250, e.g., between heat sink 252 and exterior surface 254 and/or on the exterior of heat sink 252. Power source assembly 250 or components thereof need not be potted in heat dissipating resin, but they can be in certain embodiments.

In various embodiments, the wall section of heat sink 252 may have a thickness of between about 0.5 mm and 2 mm, and in some embodiments, the wall section of heat sink 252 may have a thickness of 1 mm. In effect, various embodiments of power source assembly 250 may have dimensions of a larger-sized power source 154 (e.g., a battery may effectively increase in size from 18650 to 19650 or 20650, depending on the thickness of heat sink(s) 252). As a result, the dimensions and/or internal configuration or assembly of flashlight 100 may have to be modified to accommodate the larger-sized power source 154.

Many modifications and other embodiments set forth herein will come to mind to one skilled in the art to which these embodiments pertain having the benefit of the teachings presented in the foregoing descriptions and the associated drawings. Therefore, it is to be understood that the embodiments are not to be limited to the specific embodiments disclosed and that modifications and other embodiments are intended to be included within the scope of the invention. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the invention. In this regard, for example, different combinations of elements and/or functions than those explicitly described above are also contemplated within the scope of the invention. Although specific terms are employed herein, they are used in a generic and descriptive sense only and not for purposes of limitation.

What is claimed is:

1. A flashlight, the flashlight comprising:

a body, the body defining a longitudinal axis;

a head releasably attached to the body, the head comprising a front light defining a first axis parallel to the longitudinal axis; and a downlight defining a second axis perpendicular to the longitudinal axis;

a power source assembly, the power source assembly comprising at least one battery and at least one heat sink coupled with an exterior surface of the at least one battery to dissipate heat therefrom during use of the flashlight, wherein the at least one heat sink comprises at least one aluminum sleeve, wherein the head is selectively attachable to the body in only one of a first position and a second position, wherein in the first position the downlight faces a first direction relative to the body and in the second position the downlight faces a second direction relative to the body that is opposite the first direction.

2. The flashlight of claim 1, further comprising an indicator ring in communication with the power source assembly and configured to indicate a state of charge of the at least one battery.

3. The flashlight of claim 1, further comprising an attachment feature disposed on a lateral side of the body facing a direction different from the front light and the downlight.

4. The flashlight of claim 1, wherein the at least one aluminum sleeve is press fit over the battery.

5. The flashlight of claim 1, wherein the at least one aluminum sleeve is formed from a unitary piece of extruded aluminum.

6. The flashlight of claim 1, further comprising a layer of thermal paste disposed between the at least one aluminum sleeve and the battery exterior surface.

7. The flashlight of claim 1, wherein the front light is configured to operate as at least one of a flood light or a spot light.

8. The flashlight of claim 1, wherein the head is selectively attachable to the body via a bayonet fitting.

9. The flashlight of claim 1, wherein a maximum surface temperature of the power source assembly during use is less than 135° C.

10. The flashlight of claim 1, wherein the at least one aluminum sleeve has a wall thickness between about 0.5 mm and 2 mm.

11. A flashlight comprising:

a body;

a head releasably attached to the body and defining a proximal end and a distal end, the head comprising a first light facing a first direction and a second light facing a second direction, wherein the first and second directions are perpendicular to one another; and a power source assembly disposed in the body and in electrical communication with the first and second lights, wherein the power source assembly comprises at least one battery disposed within a heat sink formed of a thermally-conductive metal material, wherein the head is selectively attachable to the body in only one of a first position and a second position, wherein in the first position the downlight faces a first direction relative to the body and in the second position the downlight faces a second direction relative to the body that is opposite the first direction.

12. The flashlight of claim 11, further comprising an indicator ring disposed at the proximal end of the head, and wherein the indicator ring is selectively illuminable about its periphery in response to a level of charge of the power source.

13. The flashlight of claim 11, wherein the heat sink is formed as an open cylinder extending along a longitudinal axis of the at least one battery.

14. The flashlight of claim 11, wherein the heat sink has a length dimension shorter than a length dimension of the at least one battery.

15. A method of using a flashlight, the method comprising:

providing a flashlight comprising:

a body, the body defining a longitudinal axis;

a head that is selectively attachable to the body, the head comprising a first light defining a first axis parallel to the longitudinal axis and a second light defining a second axis perpendicular to the longitudinal axis; and a power source assembly comprising at least one battery coupled with a heat sink;

attaching the head to the body in a first position wherein the second light faces a first direction relative to the body; and repositioning the head with respect to the body in a second position wherein the second light faces a second direction relative to the body that is opposite the first direction, the head is repositionable in only the first position or the second position.

16. The method of claim 15, wherein the heat sink comprises a pair of panels disposed on opposing lateral sides of the at least one battery.

17. The method of claim 15, wherein at least one of the pair of panels comprises a plurality of fins.

18. The method of claim 15, wherein the heat sink comprises a sleeve disposed over the at least one battery.

19. The method of claim 15, wherein a maximum surface temperature of the power source assembly is less than 135° C. when the at least one battery is short-circuited.

* * * * *